United States Patent [19]
Wagner

[11] Patent Number: 5,798,529
[45] Date of Patent: Aug. 25, 1998

[54] FOCUSED ION BEAM METROLOGY

[75] Inventor: Alfred Wagner, Brewster, N.Y.

[73] Assignee: International Business Machines Corporation, Armonk, N.Y.

[21] Appl. No.: 654,423

[22] Filed: May 28, 1996

[51] Int. Cl.$^6$ .................................................. H01J 37/317
[52] U.S. Cl. ........................................ 250/492.2; 250/309
[58] Field of Search ........................... 250/309, 492.21, 250/492.2

[56] References Cited

U.S. PATENT DOCUMENTS

| | | | |
|---|---|---|---|
| 4,548,883 | 10/1985 | Wagner. | |
| 4,733,074 | 3/1988 | Kato et al. | 250/307 |
| 4,851,097 | 7/1989 | Hattori et al. | 204/192.33 |
| 4,910,398 | 3/1990 | Komatsu et al. | 250/307 |
| 4,924,104 | 5/1990 | Stengl et al. | 250/309 |
| 5,028,780 | 7/1991 | Kaito et al. | 250/307 |
| 5,029,250 | 7/1991 | Komatsu et al. | 250/310 |
| 5,093,572 | 3/1992 | Hosono | 250/309 |
| 5,113,072 | 5/1992 | Yamaguchi et al. | 250/309 |
| 5,159,170 | 10/1992 | Levin et al. | |
| 5,429,730 | 7/1995 | Nakamura et al. | 250/492.1 |
| 5,495,110 | 2/1996 | Ohnishi et al. | 250/309 |
| 5,504,340 | 4/1996 | Mizumura et al. | 250/309 |
| 5,569,392 | 10/1996 | Miyoshi et al. | 216/60 |

FOREIGN PATENT DOCUMENTS

WO 96/32741  10/1996  WIPO.

OTHER PUBLICATIONS

Stark, T., et al., "H2O Enhanced Focused Ion Beam Micromachining," J. Vac. Sci. Technol. B, 13(6): pp. 2565–2569 (1995), no month.

Wagner, A., et al., "Focused Ion Beam Metrology," J. Vac. Sci. Technol. B, 13(6): pp. 2629–2636 (1995), no month.

Application Note 6.0 rev. a of FEI Co., entitled "Properties of Selective Carbon Mill (H2O-based FIB Process)", (1996), no month.

*Primary Examiner*—Bruce Anderson
*Attorney, Agent, or Firm*—Scully, Scott, Murphy & Presser

[57] ABSTRACT

A focused ion beam metrology device and method are disclosed. A focused ion beam is used to measure dimensions of semiconductor features, such as top-down linewidth measurement. Low intensity focused ion beams form top view images of the semiconductor. High intensity focused ion beams etch the semiconductor in the presence of etch-enhancing material. A crater is etched to expose a cross-section the of semiconductor. The cross-section is imaged by directing low intensity focused ion beams toward the cross-section. This may be achieved by tilting the semiconductor. A three dimensional profile of a feature may be formed by successively etching the feature top surface and forming a top view image thereof. Overlaying the successive top view images forms the three dimensional profile.

43 Claims, 17 Drawing Sheets

Tilt & Image
(SEM or FIB)

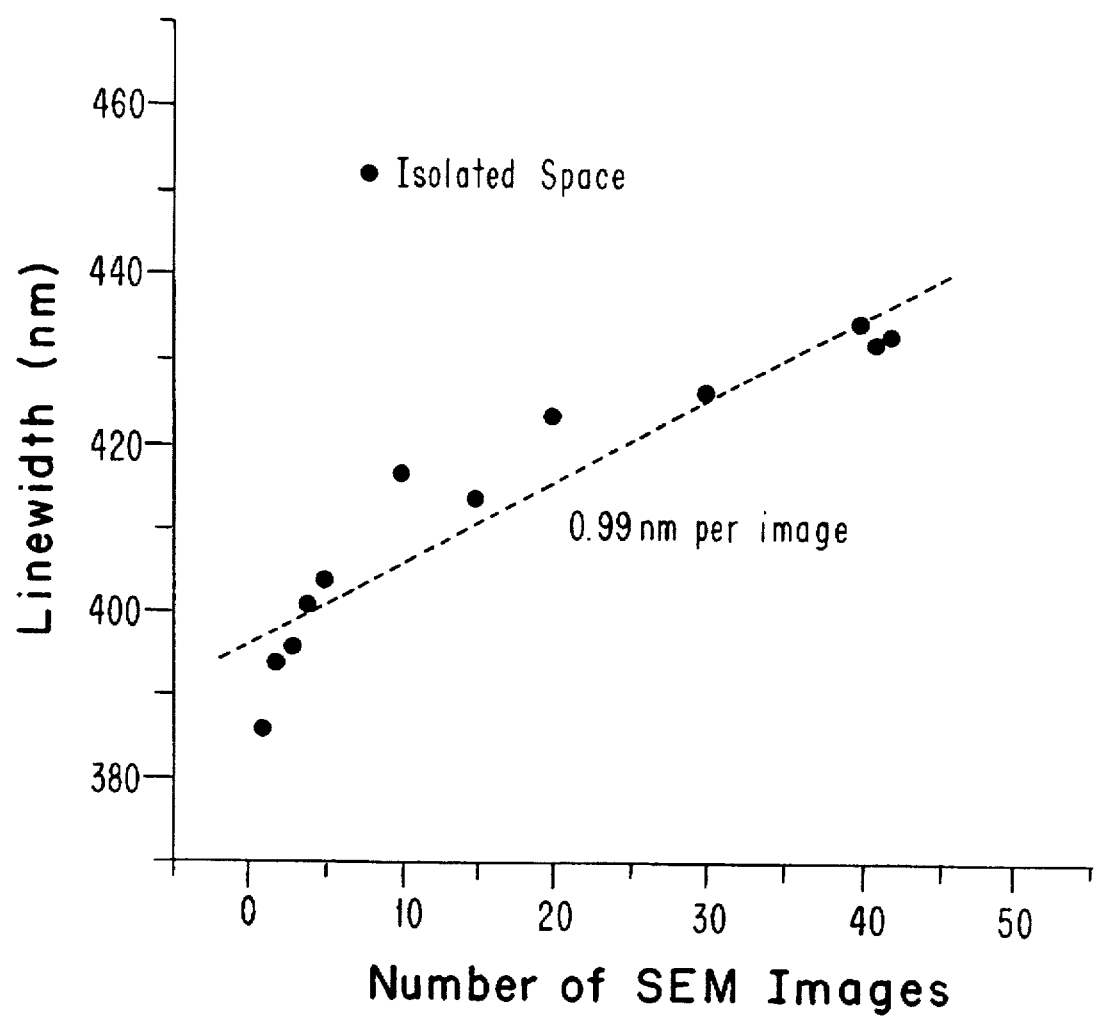

FOCUSED ION BEAM METROLOGY

BACKGROUND OF THE INVENTION

1. Field of the Invention

The present invention is directed to an ion beam metrology device and method for measuring top-down and cross-section feature sizes of semiconductor devices, where the cross-section is exposed using a focused ion beam and etch enhancing material.

2. Discussion of the Prior Art

Measuring the size of critical features is one of the key steps impacting the design, development, and fabrication of integrated circuits (ICs). Design tolerances, development cycle time, manufacturing yield, and circuit performance (speed and power) depend on accurate measurement and control of IC feature sizes. For example, small variations in linewidth measurement precision and accuracy require larger design tolerances, generally at the expense of circuit performance.

For advanced integrated circuits currently under development, these critical features range from 0.18 to 0.35 µm. In order to maintain adequate circuit performance, the size of these features must be controlled to within ±10% of the target size, i.e., ±18 to 35 nm. Ideally, linewidth measurement or metrology errors should be substantially less than the required linewidth control. This places formidable requirements on the measurement process, both in terms of accuracy and precision.

Although accuracy and precision are complex subjects when applied to semiconductor dimensional metrology, it is clear that conventional techniques will not meet the requirements of the industry in the very near future. For instance, several studies have indicated that gross differences in measurement accuracy (on the order of 100 nm) exist between careful measurements done with different "state-of-the-art" metrology tools, or even with the same tools operated by different semiconductor manufacturers. Similarly, estimates of measurement precision range from 10 to 25 nm (3σ) for critical dimension (CD) linewidth scanning electron microscopes (SEMs). Since this is comparable to the total allowed linewidth variation on an advanced integrated circuit, improvement in metrology precision is needed.

As linewidths have decreased below the wavelength of visible light, optical metrology tools have been replaced by SEMs to improve spatial resolution.

Scanning electron microscopes are currently used to measure the size of features on integrated circuits (metrology). Two types of measurements are employed: 1) top-down SEMs, used, for linewidth measurements of features, and 2) feature cross-section measurements.

Resist features are most commonly measured. Unfortunately, the energetic electron beam of the SEM interacts strongly with the resist. This detrimentally affects the measurement process in two ways. First, the measurement signal does not correspond exactly to the resist profile, but rather it is integrated over the interaction range of the electron beam. This interaction range includes an IC lateral area which can be larger than the feature area to be measured. In addition, the measurement or detector signal also includes contributions from the underlying substrate. This is because the energetic electron beam penetrates deeply into the IC, reaches the substrate, and reflects therefrom. Thus, reflection of the electron beam is not confined to reflections from the actual surface of the feature being measured, but includes additional reflections from both lateral and deeper surfaces. This large interaction range distorts linewidth measurements of the desired feature, since the detector signal is integrated over an area which is much larger than the feature area of interest.

The second detrimental effect on the SEM measurement process is SEM induced resist damage. This is due to the strong interaction of the energetic electron beam with the resist. The SEM induced damage in the resist causes small changes in the measured linewidth. These changes accumulate with successive measurement and decrease accuracy in both top-down and cross-sectional measurements. As the electron beam travels through the resist, it affects the bulk of the polymer by volatilizing and shrinking the resist. The resulting volume shrinkage of the resist induces dimensional change in resist images. Thus the very act of measuring the resist with an electron beam induces measurement errors.

Another disadvantage of using SEMs to measure cross-sections of resist layers includes cleaving the silicon wafer across the region of interest. The wafer is cleaved or broken in pieces so that an SEM can scan the resist wall profiles at the fracture surface, i.e., the cross-section. Measuring resist wall profiles is increasingly critical as dimensions of ICs decrease.

FIG. 1 shows a perspective view of a typical resist 10 having a thickness 12. The lateral dimensions of the resist 10 are shown as width 14 and length 16. Width 14 of the resist 10 increases with depth, where the resist 10 is widest at its base. Because the feature width 14 increases with depth 12, the feature 10 has sloped side-walls 18. A cross-section of the sloped side-walls 18 shows a profile of the resist 10, which profile has a sloped edge 20.

While the lateral dimensions of resist features have decreased over time, the thickness of the resist has remained relatively constant. With lateral dimensions now approaching 0.25 µm and a thickness of 1 µm, resist features are increasingly three dimensional. As a result, small variation or uncertainty in the edge slope of the resist feature can have a significant impact on the effective width of the feature. Unfortunately, top-down CD measurements generally are unable to detect the contribution of resist wall profiles to the effective size of critical features. Therefore, careful control and characterization of resist profiles is increasingly needed.

Characterizing three-dimensional resist profiles by cleaving the active silicon wafer, and viewing the fracture surface with an SEM is a useful method of visualizing resist profiles. However, this method is very costly since the entire silicon wafer is destroyed.

Attempts have been made to observe a semiconductor cross-section for failure analysis without cleaving or breaking the entire silicon wafer. One method uses focused ion beams (FIBs) for maskless etching to partially expose the semiconductor cross-section. U.S. Pat. No. 5,093,572 (Hosono) discloses an apparatus having a FIB source and an SEM. The FIB cuts a cross-section in a semiconductor wafer at a desired location, while the SEM is used to monitor the cutting and observe the cross-section. However, for uneven surfaces, e.g., surface containing a trench, sputtered material may be redeposited in the trench during the maskless etching. This distorts the cross-section image.

U.S. Pat. No. 5,028,780 (Kaito) prevents such image distortions by forming an even surface prior to the maskless etching. Kaito fills trenches of an uneven surface by maskless deposition of film using a focused ion beam chemical-vapor-deposition (FIBCVD) process. The Kaito process of leveling the uneven surface prior to maskless etching results in a cross-section image which is less distorted that an image obtained without leveling the uneven surface. Such an image is suitable to detect failures. However, the Kaito image is not suitable for metrology functions to make accurate dimension measurements of the exposed cross-section. This is partially due to imperfections in the filled/leveled surface, which imperfections distort the image. Moreover, the Kaito process includes additional steps associated with leveling the uneven surface. This increases time and cost of such a process. In addition, the maskless etching of Kaito is slow. Although etching can be increased by increasing the FIB current, this reduces image accuracy due to the larger beam diameter of the high current FIB.

Conventional resist cross-sectioning devices and methods using FIBs suffer from redeposition of sputtered material and from inability to limit erosion over small areas. Erosion is not limited to a small area because FIBs, which are non-Gaussian, have considerable energy in tails extending far beyond the beam center. The tail energy etches large areas (not confined to the center of the FIB) and causes distortion of the resist profiles in the region around the cross-section. In addition to being inaccurate, conventional FIB etching is slow.

SUMMARY OF THE INVENTION

The object of the present invention is to provide a focused ion beam (FIB) metrology device and method for performing metrology functions, such as measuring the size of a feature, that eliminate the problems of conventional metrology devices and methods.

Another object is to provide an FIB metrology device and method for accurate top-down measurements of semiconductor feature sizes.

Yet another object is to provide an FIB metrology device and method where minimal damage results to various layers of a semiconductor during partial exposure of the semiconductor's cross-section, allowing in-situ cross-sectional measurements without breaking the wafer.

A further object is to provide an FIB metrology device and method where accurate wafer cross-sections, three dimensional feature profile, and images thereof are obtained quickly.

These and other objects of the present invention are achieved by an FIB metrology device comprising a focused ion beam source which produces low intensity, low energy focused ion beams directed to a semiconductor device having features thereon. A detector detects electrons or ions emitted from the semiconductor device and provides data to a processor. The processor measures dimensions of these features. A display device may be connected to the processor to display an image of the semiconductor device. In one embodiment, the detector is located substantially above the semiconductor device for top-down linewidth measurements.

In another embodiment, a control device is connected to the ion beam device to vary intensity of the focused ion beams and generate low or high intensity focused ion beams. The high intensity focused ion beams successively etch a top surface of the feature, while an etch-enhancing material is introduced toward the semiconductor device by a discharge device to increase accuracy and speed of the etching. Illustratively, the etch-enhancing material is water vapor or hydrogen peroxide gas, or a combination of the two gases. A low intensity ion beam scans the feature between successive etches to produce successive top-down images of the feature. The processor overlays the successive top-down feature images to form a three-dimensional profile of the feature.

In yet another embodiment of the present invention, high intensity ion beams etch a crater in the semiconductor device exposing a cross-section thereof. An etch enhancing material, such as water vapor or hydrogen peroxide gas, may be introduced by a discharge device during the formation of the crater to increase the speed and accuracy of the etching. The cross-section is scanned with low intensity ion beams at a predetermined angle to form an image thereof. Prior to etching the crater, the semiconductor device may be planarized by selectively depositing a selected material introduced toward the semiconductor device by the discharge device. Illustratively, the selected material may be gold, platinum, tungsten, aluminum or carbon.

The metrology device may have a movable platform for holding the semiconductor device, wherein the movable platform is tilted at the predetermined angle during the low intensity ion beam scanning of the cross-section. Alternatively, the metrology device may have a second focused ion beam source which is angularly displaced from the first FIB source by the predetermined angle to scan the cross-section with a low intensity ion beam to form the cross-section image. Instead of the second FIB source, an scanning electron microscope (SEM) may be used to scan the cross-section with an electron beam, and produce an image thereof.

In a further embodiment, a method for measuring size of a semiconductor feature comprises the steps of:
  (a) scanning a semiconductor device with low intensity focused ion beams from an ion beam source;
  (b) detecting electrons or ions emitted from the semiconductor device using a detector; and
  (c) measuring linewidth feature dimensions of the semiconductor device from the detected electrons or ions by a processor connected to the detector.

In addition to step (c), the step of forming a top-down image of the semiconductor device on an image forming device connected to the processor may be performed.

In another embodiment, a method of etching a semiconductor device comprises the steps of:
  introducing an etch-enhancing material toward the semiconductor device through a discharge device; and
  etching the semiconductor device with a focused ion beam from a first ion beam source;
  wherein the introducing step increases speed and accuracy of the etching step.

In yet another method, a three-dimensional profile of a feature may be formed by overlaying successive top-down images of the feature formed between successive etching of top feature surfaces. A further method includes etching a crater to expose a cross-section of the semiconductor device, and forming an image of the cross-section using an electron or a low intensity ion beam directed to the cross-section at a predetermined angle. This may be achieved by an electron beam source, or another low intensity ion beam source, angularly displaced from the first ion beam source by the predetermined angle. Alternatively, the semiconductor device is tilted by the predetermined angle.

BRIEF DESCRIPTION OF THE DRAWINGS

FIGS. 11a–11c show the measured width of lines and spaces as a function of repeated measurements using a conventional 20 kV electron beam;

DETAILED DESCRIPTION OF THE INVENTION

Figure 2:
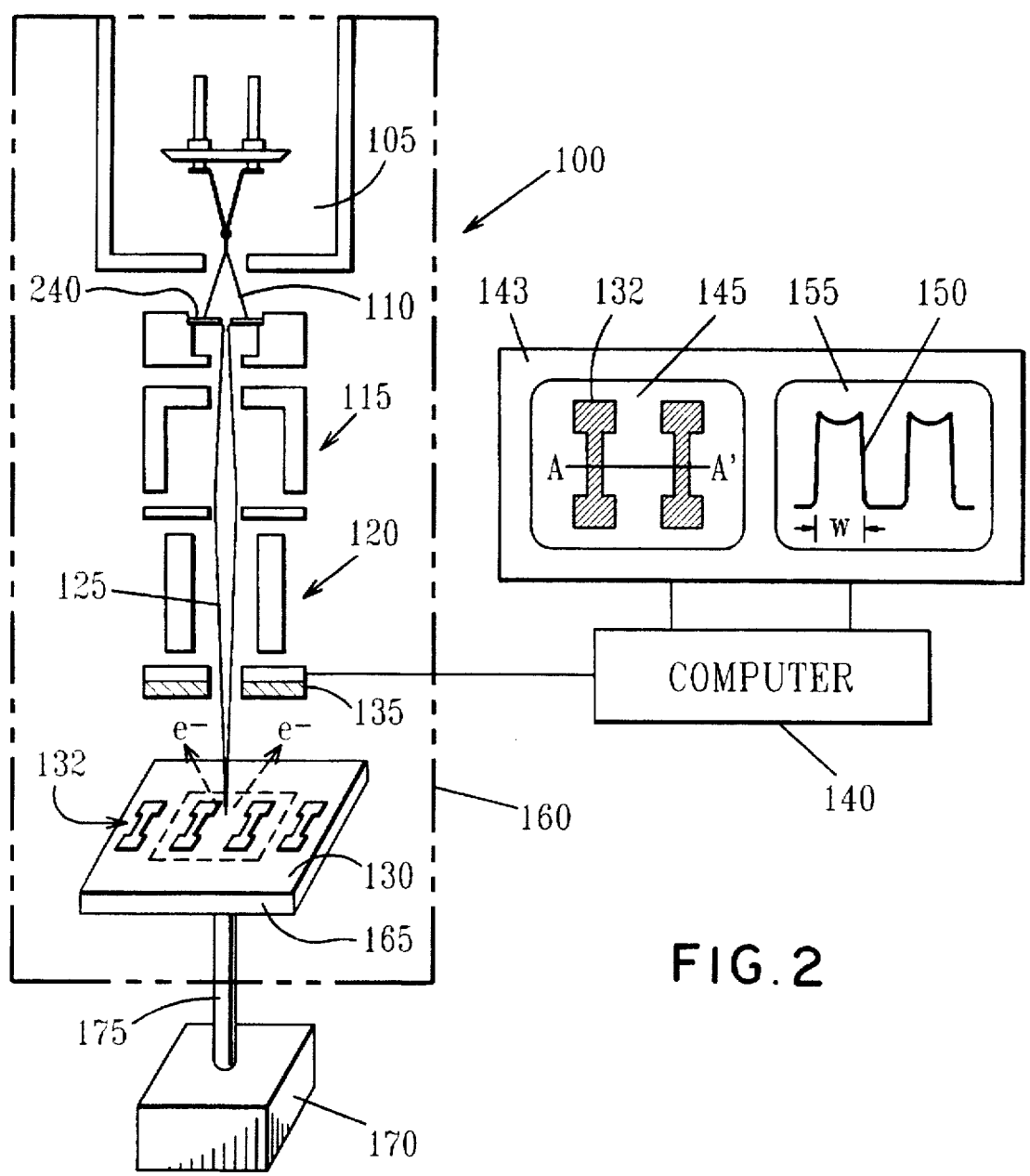
FIG. 2 shows an FIB metrology device for top-down linewidth measurements according to one embodiment of the present invention.

According to one embodiment of the present invention, FIG. 2 shows a focused ion beam (FIB) metrology device 100 used for top-down feature dimension measurements, e.g., linewidth measurements, of a semiconductor integrated circuit (IC) device. The FIB device 100 comprises a liquid metal ion source 105 which generates an ion beam 110. A lens 115 focuses the generated ion beam 110 and a deflector 120 deflects the focused ion beam (FIB) 125 toward a sample 130. The sample 130 may be a semiconductor wafer containing many integrated circuits or chips. IC features 132, to be measured by the FIB device 100, are located on the surface of the sample 130.

A detector 135 detects electrons e⁻ reflected form the sample 130 as a result of the FIB 125 impinging thereon. The detector 135 is located directly above the sample 130. The focused ion beam 125 is approximately perpendicular to the sample 130, thus producing an image and measurement which is termed "top down". The detector is connected to a processor 140 which receives data representing the detected electrons or ions. The processor 140 may be a computer. The computer processes the data and calculates IC feature dimensions, e.g., feature linewidth w. That is, the processor 140 measures dimensions of these features. In addition, the computer 140 is connected to an image forming device 143 which displays an image of a top view of the IC feature 132 onto a display device or screen 145 for observation. The computer 140 and image forming device 143 also compute and display a pulse 150 on a second screen 155. The width w of pulse 150 represents the width of the feature 132 along line AA'. Illustratively, the image forming device 143 forms digital picture using computer hardware and software to enhance the image.

The detector 135 and sample 130 may be located inside a sample chamber 160 which may be a vacuum chamber. The sample 130 may be located over a moveable platform 165 enclosed in the chamber 160. The platform 165 may rotate and/or tilt using a driving device 170 connected to the platform 165 via a shaft 175. In addition, the platform 165 may move laterally. For top-down linewidth measurements, the platform 165 is substantially parallel to the detector 135 and the FIB 125 is substantially perpendicular to the platform 165 having the sample 130 thereon.

The FIB source 105 is controllable to produce FIBs 125 of different beamwidths. This is achieved by a control device 240 which determines the current in the FIB device 100. Increasing the FIB current, increases the FIB intensity and beamwidth. The FIB device 100 also includes controls to position and/or scan the FIB 125 across desired locations of the sample 130. For example, deflector 120 may be used to position and scan the FIB 125 over the sample 130, by varying a voltage applied across electrostatic plates of the deflector. The FIB metrology device 100 is not confined to mere failure analysis, but provides accurate top-down linewidth measurements of small feature sizes on the order of 0.10 µm.

It is unexpected that FIBs could be used for top-down linewidth measurements, since one skilled in the art would have believed that ion beams are more damaging to materials than electron beams from an SEM. Surprisingly, experiments with FIBs in accordance with the invention show that FIBs have mostly a surface effect, with ions penetrating about 100 Å into the surface of the material (such as a resist), and the damage done by the ion beam has less effect on the resist feature size than an electron beam. Illustratively, the resist is a polymer resist or other carbon containing materials. Unlike electron beams, FIBs do not volatilize and shrink the bulk of polymer materials during measurement.

The FIB metrology device 100 may be used for top-down linewidth measurements using the following steps:

(a) scanning the sample 130 with low intensity focused ion beams generated from the ion beam source 105;

(b) detecting electrons e⁻ or ions emitted from the sample 130 by the detector 135; and (c) measuring linewidth feature dimensions of the sample 130 from the detected electrons or ions by the processor 140 connected to the detector 135.

Scanning or positioning the FIB 125 is performed over a desired location of the sample 130. A low current, thus narrow FIB, is used to provide an accurate image of the sample. Illustratively, the intensity of the FIB used for top-down linewidth measurements is approximately between 1 pA to 20 pA. As compared to scanning with an SEM, scanning with the FIB 125, reduces dimensional changes to the feature 132.

In addition, after step (c), a top-down image of the sample 130 and feature 132 is formed on a screen 145 of the image forming device 143, which is connected to the processor 140. The pulse 150, having a width w equaling the feature width, may also be formed on the other screen 155 of the image forming device 143. Measuring the linewidth includes processing data received from the detector 135 by the processor 140, and providing the processed data to the image forming device 143.

Figure 3:
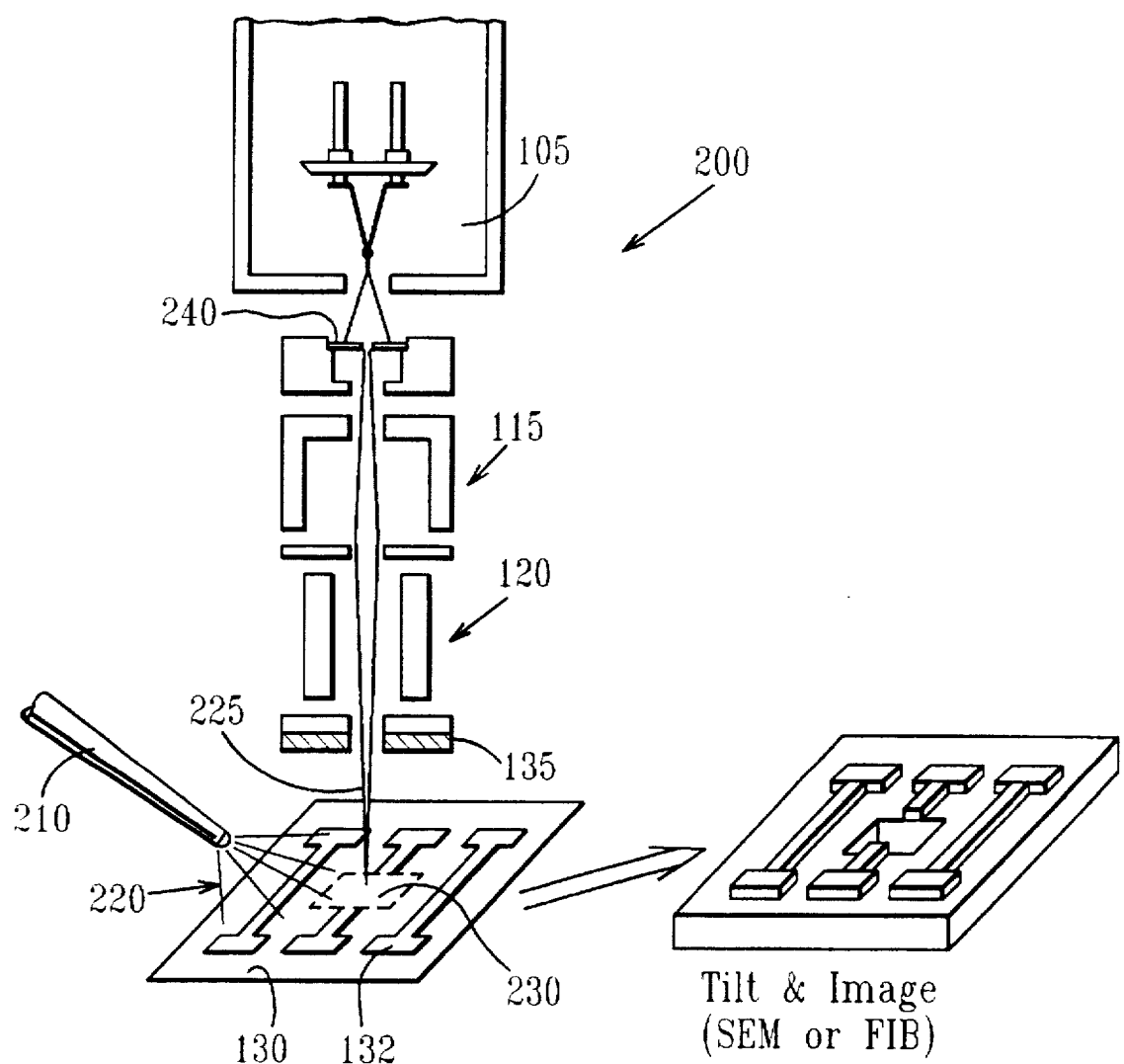
FIG. 3 shows another FIB metrology device for exposing and measuring resist cross-sections using gas assisted etching according to the present invention.

FIG. 3 shows another embodiment 200 of an FIB metrology device used for obtaining and imaging a cross-section of the semiconductor device or feature thereof. The cross-sectioning FIB metrology device 200 has similar features as the top-down FIB metrology device 100 of FIG. 2. For simplicity, the chamber 160, tilting platform 165, driving device 170, processor 140, and image forming device 143 are not shown in FIG. 3. In addition to the FIB metrology device 100 of FIG. 2, the cross-sectioning FIB device 200 has a discharge device 210, such as a gas delivery system, which introduces desired material, such as etch-enhancing materials 220, toward the sample 130.

A high intensity FIB 225 etches a crater 230 in a region of interest to expose a cross-section of the feature 132. For example, a rectangular crater 230 is masklessly etched using the FIB 225 and the etching gas 220. Illustratively, the etching gas is water ($H_2O$) vapor or hydrogen peroxide ($H_2O_2$) vapor or a combination of both. The high intensity FIB 225 is also used with the etch-enhancing material to completely cut through the IC feature quickly and accurately.

The etch enhancing material enhances the etching and forms a higher quality crater 230 at a faster rate. The etch-enhancing material increases the polymer etch rate, suppresses sputter erosion of the underlying silicon substrate, and prevents redeposition of back sputtered material in the crater 230 and surrounding features. Thus, etch time is reduced and crater quality increased resulting in faster and higher quality images of the feature cross-section profile.

An added advantage of this method is the minimal damage to the rest of the wafer. Although the bisected feature is destroyed, the remainder of the wafer is intact and available for further processing. Furthermore, cross-sections can be limited to the kerf region between chips, or to sacrificial chips dedicated to measurement purposes to minimize the economic impact. Since cross-sections can be formed anywhere on the wafer, a thorough characterization of resist profiles within a wafer is achieved using FIBs.

The intensity of the FIB used to etch the crater 230 is approximately between 20 pA to 1000 pA. This is higher than the intensity of the FIB 125 of FIG. 2 used to scan and image the top surface of the sample 130, but lower than the intensity of an FIB necessary to etch without the etch-enhancing material. The lower intensity FIBs used with gas-assisted etching have narrower beamwidths, thus increasing the etching accuracy.

In addition to increasing the accuracy of etching, the etch-enhancing gas 220 greatly reduces the time required to sputter erode the crater 230. This is because the etch-enhancing gas reacts with material irradiated by the FIB, thereby forming volatile compounds, and prevents deposition thereof back on the sample 130.

Figure 4:
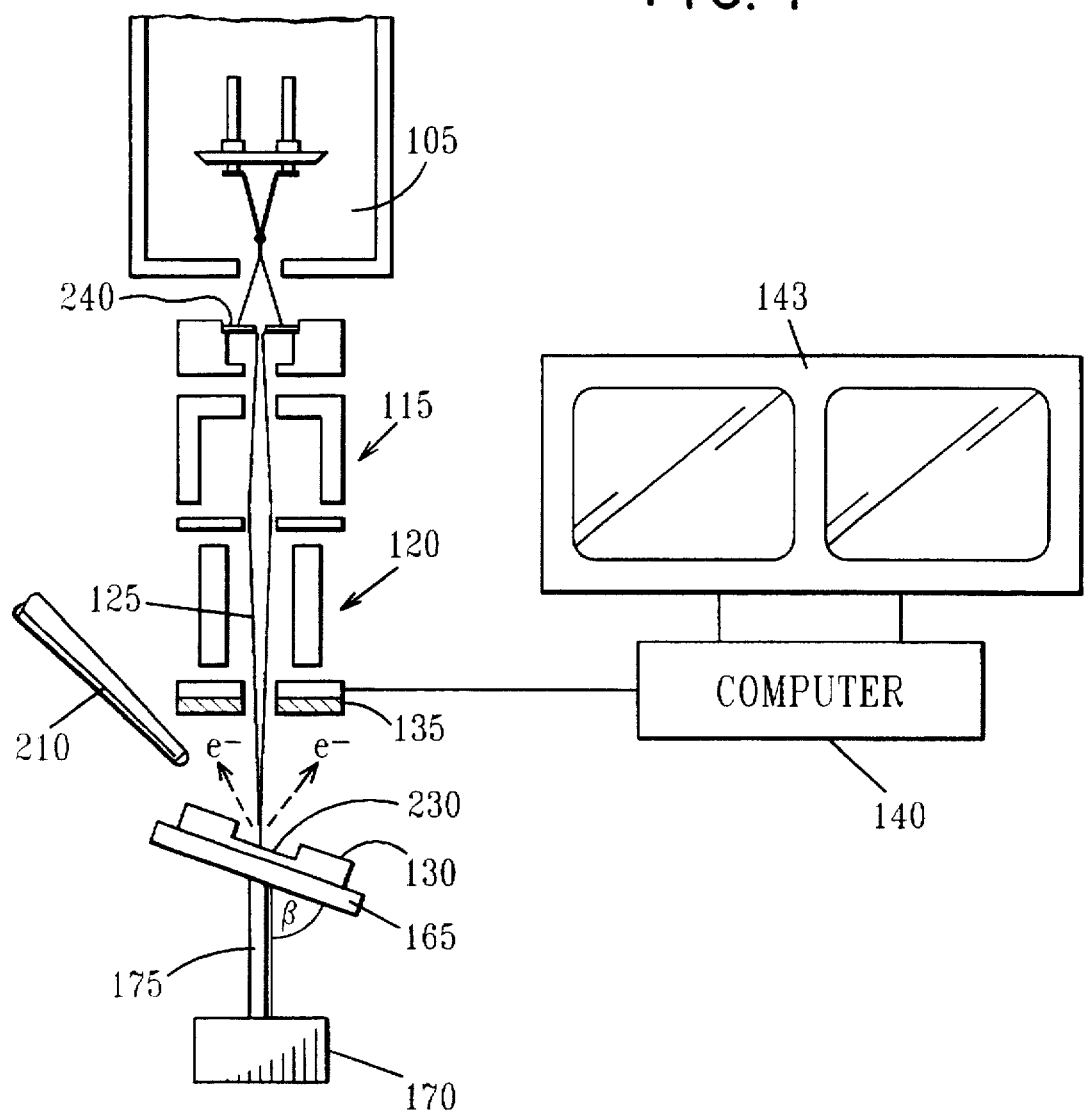
FIG. 4 shows the FIB metrology device of FIG. 3 where the cross-section is tilted for imaging according to the present invention.

After forming the crater 230 and exposing the feature cross-section, the sample 130 is tilted for imaging. A low intensity FIB is used to scan and image the cross-section. This is shown in FIG. 4, where the platform 165 is tilted and sidewalls of the crater 230, i.e., the sample cross-section, is scanned with a low intensity FIB 125 generated from the ion beam source 105. In this case, a control device 240 varies the intensity of the FIB, for example, by varying the diameter of the aperture in the control device 240. The control device 240 is connected to a mechanical exchange mechanism to vary the intensity of the focused ion beams and generate low or high intensity focused ion beams. Alternatively, the control device 240 may comprise a lens and aperture assembly which can be electronically modulated to vary the beam current. The platform 165 is tilted by a predetermined angel β (and/or rotated) so that a desired view angle is achieved in relation to the low intensity FIB 125. Illustratively, the predetermined angles α is between 40° to 75°.

Similar to FIG. 2, an image of the cross-section is formed on the image forming device 143. In response to the reflected electrons e⁻ or ions, the detector 135 provides a signal to the image forming device 143 through the processor 140, to form an image on a display for viewing.

Figure 5:
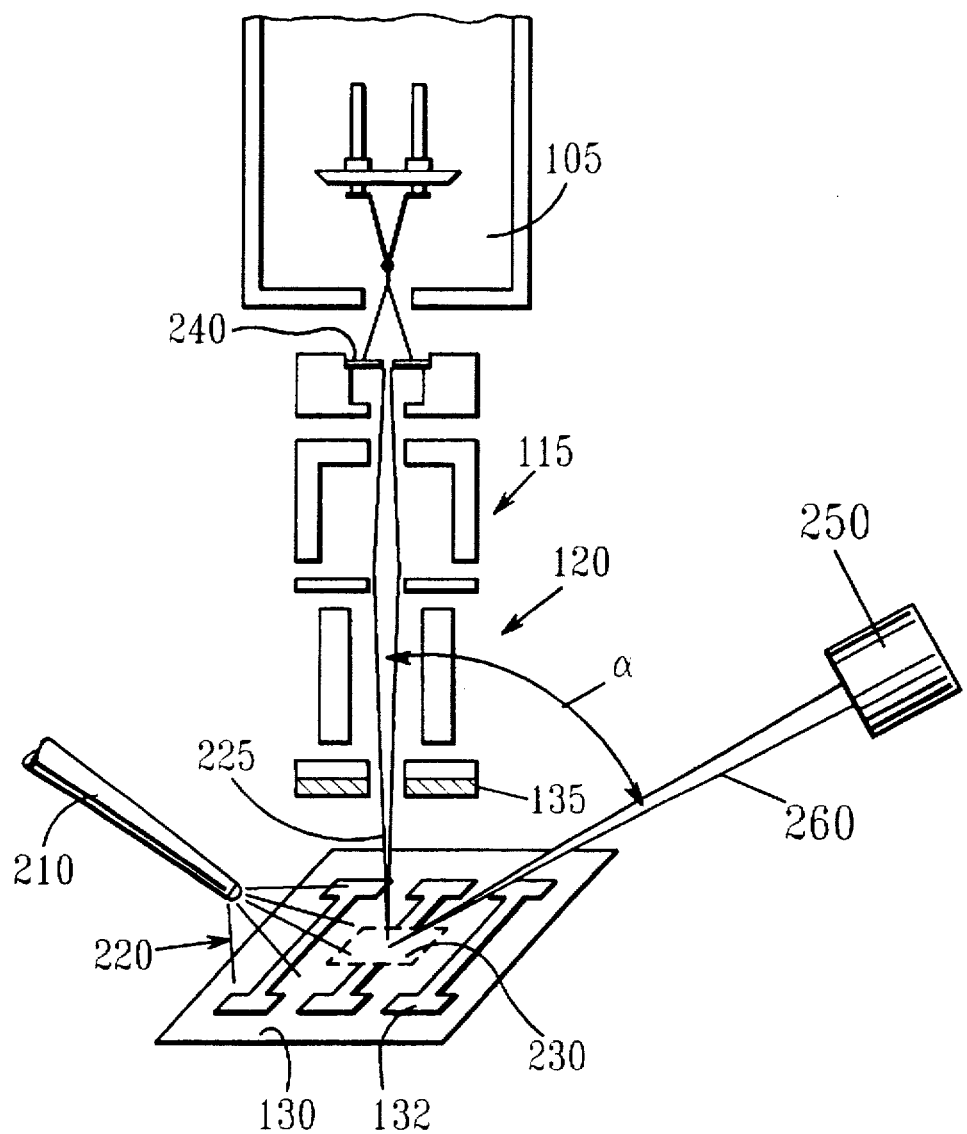
FIG. 5 shows the FIB metrology device of FIG. 3 where the a separate scanning device is used to image the cross-section according to the present invention.

Alternatively, as shown in FIG. 5, instead of tilting the sample 130, a second scanning device 250 may be angularly displaced at a predetermined angle α from the ion beam source 105, to generate beams 260 directed toward the crater 230 to impinge on the cross-section. Illustratively, the predetermined angles α is between 40° to 75° from an axis parallel to the high intensity FIB 225. The second scanning device 250 may be another FIB source similar to the FIB source 105. Alternatively, the second scanning device 250 may be a scanning electron microscope (SEM).

To further enhance surface measurements, maskless deposition of material is performed prior to etching. This deposition is performed by introducing deposition material toward the sample 130, through the discharge device 210. Alternatively, a second discharge device may be used. Using the FIB, this material is selectively and masklessly deposited on the sample 130 to fill trenches 220 located between the features or resist lines 132. This planarizes or levels the uneven surface of the sample 130 and prevents redeposition of volatilized or etched material back in the trenches during subsequent maskless etching to form the crater 230. In addition, the deposited material eliminates beam induced charging effects during FIB measurements. Illustratively, the deposition material is gold (Au), platinum (Pt), tungsten (W), aluminum (Al), or carbon (C).

The crater 230 that exposes the cross-section of the feature may be formed using the following steps:

introducing an etch-enhancing material toward the semiconductor device through a discharge device; and etching the semiconductor device with a focused ion beam from an ion beam source.

Once the crater 230 exposing the cross-section is formed, the platform 165 holding the etched sample 130 is tilted for imaging. Imaging the cross-section is achieved using the following step:

directing a low intensity ion beam toward the cross-section; and forming an image of the cross-section on an image forming device from low intensity ion beams generated from the ion beam source and reflected from the cross-section.

The directing step includes the step of tilting the semiconductor device so that the cross-section faces toward the ion beam source. Alternatively, the directing step includes the step of generating the low intensity ion beam from a second ion beam source angularly displaced from the first ion beam source by a predetermined angle. Instead of the second ion beam source, an SEM may be used.

The embodiment shown in FIG. 3 may also produce three-dimensional (3-D) images of the feature or resist profile. Referring to FIGS. 2 and 3, the ion beam device 200 produces a low intensity FIB 125 to produces a top-down image of the resist as discussed in connection with FIG. 2. Next, the ion beam device 200 generates a high intensity FIB 225 (FIG. 3), while the etch-enhancing gas 220 is introduced toward the sample 130. The high intensity FIB 225 etches the top surface of the resist. A top-down image of the etched resist is formed using the low intensity FIB 125. The imaging and etching is repeated and successive images overlaid to form the 3-D profile of the resist.

Figure 6:
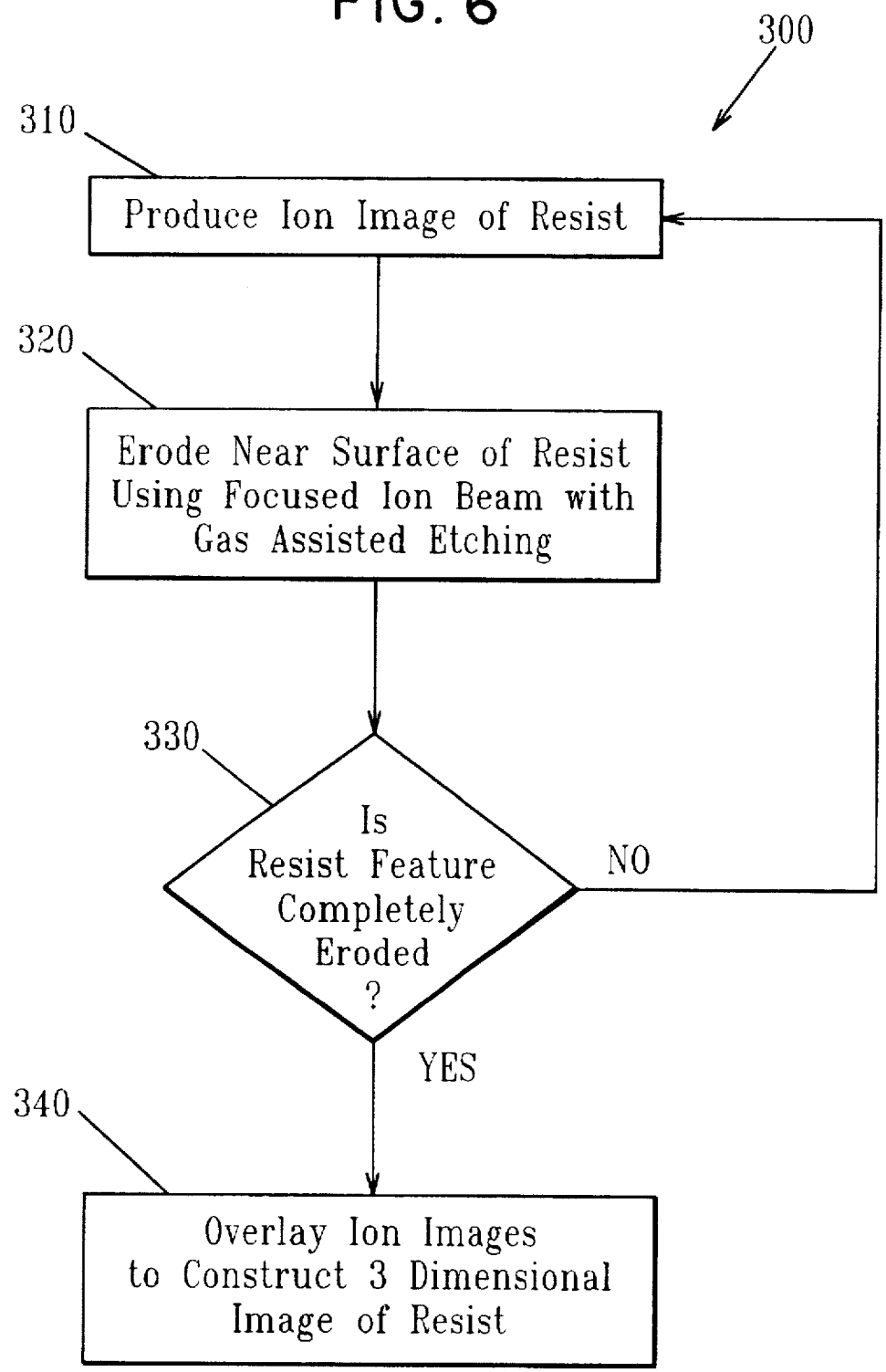
FIG. 6 shows a flow chart of a method to produce three dimensional images of resist features using the FIB metrology device of FIG. 3 with gas assisted etching according to the present invention.

FIG. 6 shows a flow chart of a method 300 to produce 3-D images of resist features using FIB with gas assisted etching. As shown in FIG. 6, in step 310 a top-down ion image of the feature or resist is produced using a low intensity FIB, as discussed in connection with FIG. 2. In step 320, the top or near surface of the resist is etched using gas assisted high intensity FIB, as discussed in connection with FIG. 3. In step 330, a determination is made whether the resist feature is completely eroded. If not, then steps 310 and 320 are repeated. If yes, then step 340 is performed where the successive top-down ion images are overlaid to construct the 3-D image of the resist. The processor 140 shown in FIG. 2 processes and overlays the ion images for display on the image forming device 143.

Figure 7A:
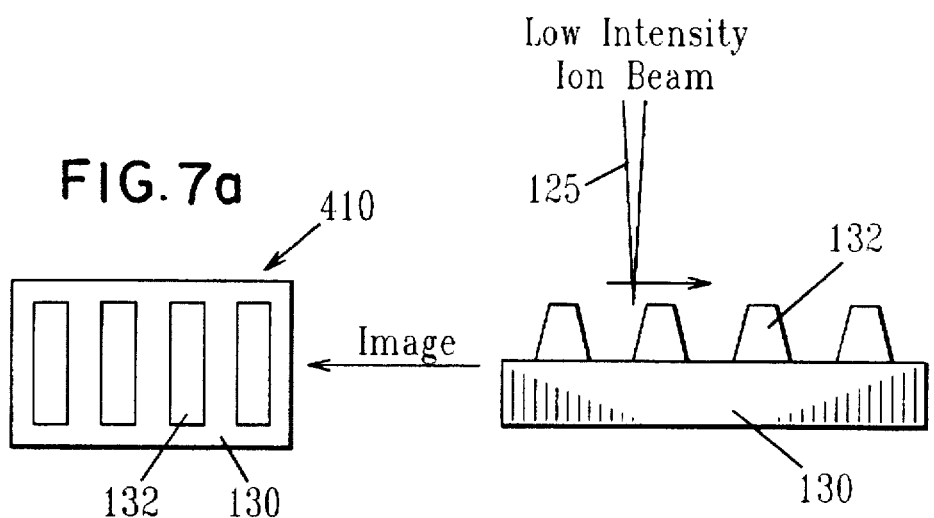
FIGS. 7a–7c show the method of FIG. 6 in greater detail according to the present invention.
Figure 7B:
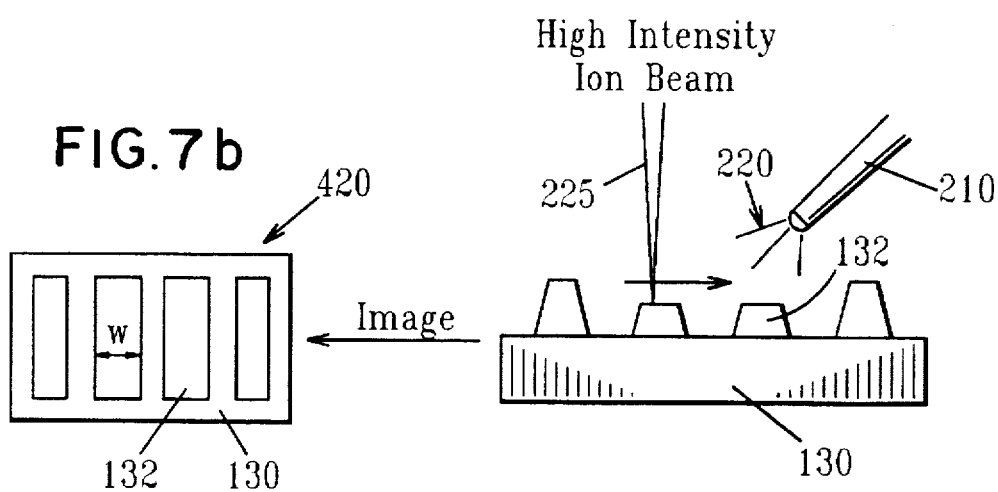
Figure 7C:
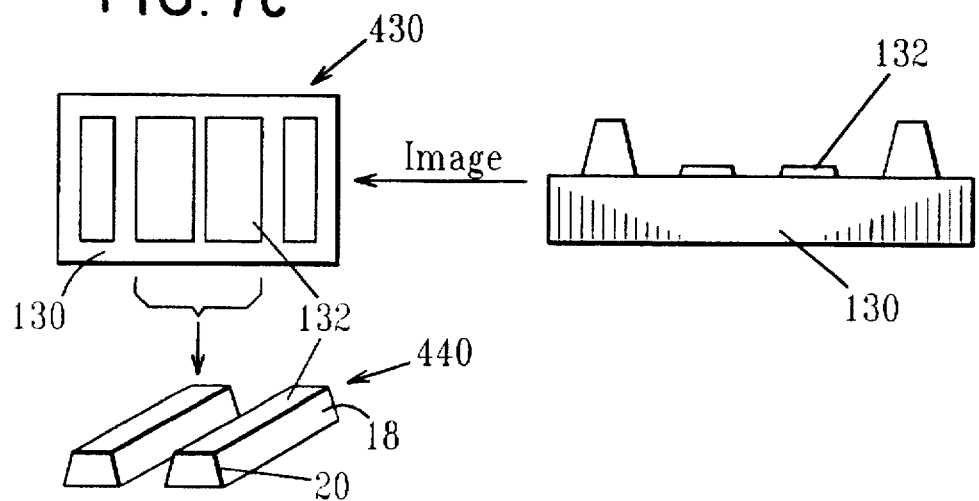

FIGS. 7a–7c show the method 300 of FIG. 6 in greater detail. A top-down ion image 410, shown in FIG. 7a, is produced using similar steps described in connection with FIG. 2. A low current FIB 125, hence a narrow FIB, is used to scan the surface of this sample 130 and produce the top-down image 410.

In FIG. 7b, an FIB 225, having a higher current than the FIB 125 of FIG. 7a, is used to masklessly etch the top surface of the resist 132. The etch enhancing gas 220 is introduced toward the sample 130 from the discharge device 210. The gas 220 allows to quickly etch the resist 132 and to reduce the current of FIB 225 required for etching. This is similar to the description in connection with FIG. 3. Note, the width w of the etched resist 132 in FIG. 7b is larger than the resist width in FIG. 7a.

Next, a top-down image 420 of the etched resist 132 is produced using the low intensity FIB 125 shown in FIG. 7a. FIG. 7c shows further etching the near or top surface of the resist 132 using the gas assisted high intensity FIB etching. Another top-down image 430 is produced by scanning the etched resist with the low intensity FIB 125.

Figure 1:
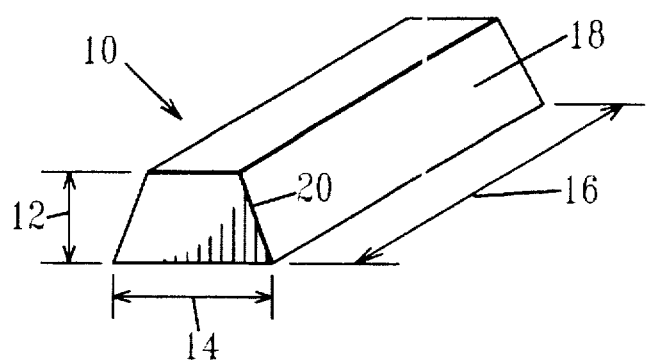
FIG. 1 shows a perspective view of a typical resist.

As described in connection with FIG. 6, etching and image forming is repeated until the resist 132 is completely eroded. The successive images 410, 420, 430 are overlaid to produce a resist 3-D image 440 resist, allowing reconstruction and visualization of the feature profile, complete with sloping walls 18 and sloped edge 20. The resist profile is shown in greater detail in FIG. 1. The processor 140 and image forming device 143, shown in FIG. 2, overlay the successive resist image and display the profile 440 on the screen 145.

The FIB metrology device and method provide accurate images in a short time that allow measuring feature dimensions of the sample IC. Conventional FIB devices are incapable of providing accurate images in relatively short time. Hence, prior art FIB devices are not suitable for metrology, i.e. measuring feature sizes. Instead, conventional FIB devices are confined to failure analysis rather than accurate dimension measurements.

Unlike conventional FIBs, where an image enhanced by selective deposition is used for failure analysis, the enhanced image of the FIB device 100 is accurate enough for use in actual precise feature size spatial measurements.

The FIB metrology device precisely measures feature dimensions in a top-down view, where a low energy, low current/narrow FIB is used. Scanning with a low energy, low current/narrow FIB allows formation of an accurate image and measurement for at least two reasons. First, the low current FIB allows higher resolution and accuracy due to the narrow beam. Second, the ions from a low energy FIB have an exceedingly short penetration depth. Utilizing an ion beam, particularly a low energy, low current ion beam, causes only a surface effect, since ions penetrate only about 0.01 μm verses over 1 μm for electron beams from an SEM.

Unlike electrons, the ions do not penetrate all the way through a layer of resist to cause resist shrinkage and change the measurement in the act of measuring. The low penetrating ions do not shrink the resist during measurement. The ion beam behaves like an ultra low energy electron beam, however the FIB produces sharper and more accurate images in a much shorter time than the ultra low energy electron beam.

In addition, the short penetration depth of the FIB reduces damage to the sample, and only reflects the near or top sample surface. This provides an accurate an image. Thus, in comparison to an electron beam, images formed by the FIB have significantly reduced lateral contribution, allowing a sharp focused image of the desired area, rather than an image which is integrated over a large lateral area. Moreover, unlike images formed using electron beams, variations in the substrate have no effect on images formed by the short penetrating FIBs.

The ion beam behaves like an ideal electron beam for top-down linewidth measurement. In addition to top-down measurements, the FIB device also quickly and accurately etches or cuts a clean crater or cross-section of the wafer. The exposed cross-section is measured without completely cutting the wafer.

Since an ion beam carries significant momentum, it can be used to sputter-erode a surface. By repeatedly scanning the ion beam in the region around the feature of interest, a crater bisecting the feature can be formed. By simply tilting the silicon wafer, the cross-section of this bisected feature can be viewed either with the ion beam or in an SEM.

Furthermore, the FIB device also successively etches and images top surfaces of resist. Overlapping the successive top-down images allows three-dimensional visualization of IC features.

The present invention is described in further detail referring to some examples below. However, it should be understood that the present invention is not to be construed as being limited to these examples.

FIB Top-Down Critical Dimension (line width) Metrology

The following examples demonstrate the improved precision in the measurement of critical resist dimensions.

A finely focused ion beam was raster scanned over a sample to produce high resolution images, similar to the scanning electron microscope. These ion images were analyzed to determine the size of features in the same way that optical and electron microscopes are used. Ion images of resist structures were obtained with JEOL (Japan Electro Optics Laboratory) 106D focused ion beam system, using a 15 pA, 50-nm-diam, 100 kV gallium ion beam.

The ion beam was scanned over the resist sample with a pixel step rate of 4 MHZ, delivering a total ion dose of approximately $6 \times 10^{13}$ ions per $cm^2$ per image. The ion images were captured, converted into appropriate image formats (e.g., TIFF and RAS), and stored digitally. The resist was a chemically amplified deep UV resist (IBM Apex resist), and the exposures were done using x-ray lithography. The resist was coated with a thin layer of gold palladium to eliminate beam induced charging effects during FIB and SEM measurements. The stored ion images were analyzed off-line using a Princeton Gamma Technology Inc. (PGT) linewidth measurement system. The PGT system was also connected to a Hitachi S-4000 low voltage SEM. This allows direct comparison of ion beam measurements with SEM-based measurements using the same analysis system and analysis algorithms.

Figure 8A:
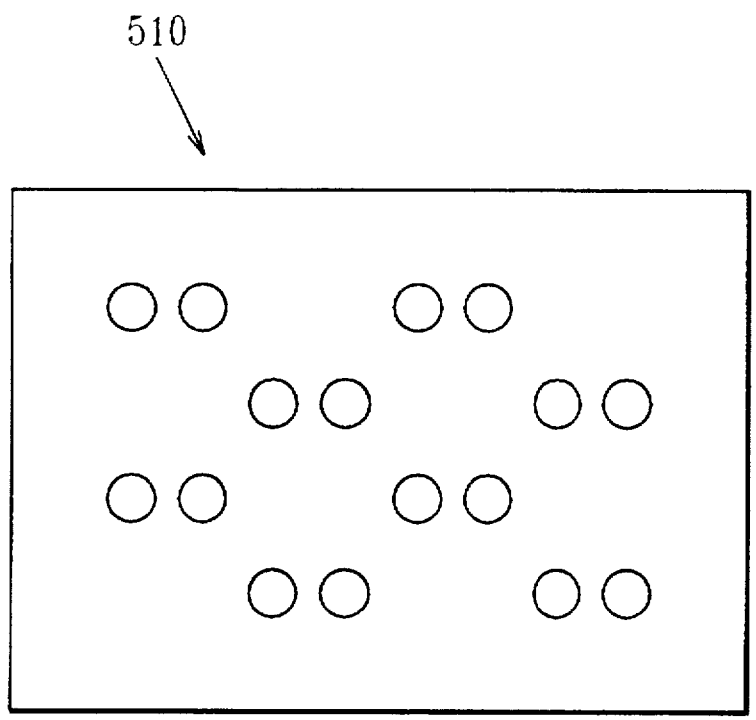
FIGS. 8a–8b show images obtained by the FIB metrology device of FIG. 2 according to the present invention.
Figure 8B:
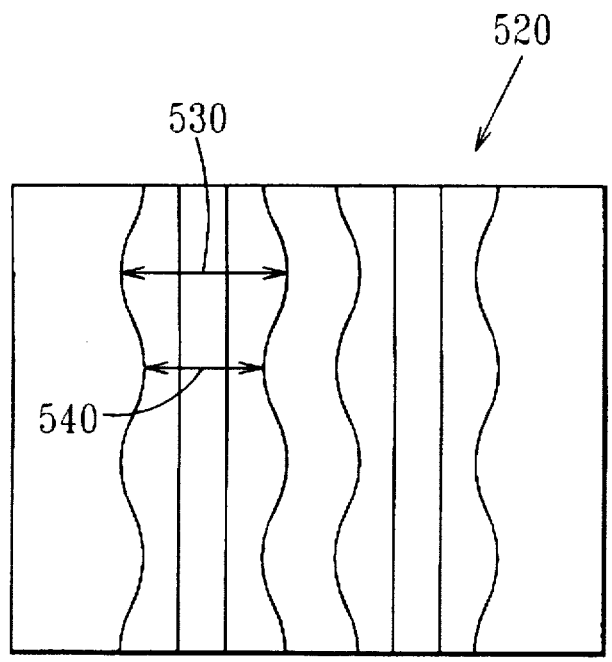

FIG. 8a shows an ion image of a 510 nm nominal trench capacitor resist structure. The mean width of the capacitor trenches, determined from the ion image, is 267 nm, with a 3σ deviation of 16 nm. FIG. 8b shows an ion image of 520 nm nominal gate conductor pattern. Two sites are 530, 540 are identified on the straight spaces in the image, corresponding to different neighboring resist structures. The measured mean linewidths were 205 and 216 nm for sites 530 and 540, respectively, with 3σ deviations of 11 nm. The ion measurement results shown in FIGS. 8a and 8b are comparable or superior to the precision obtained with the Hitachi SEM on the same samples.

Figure 9A:
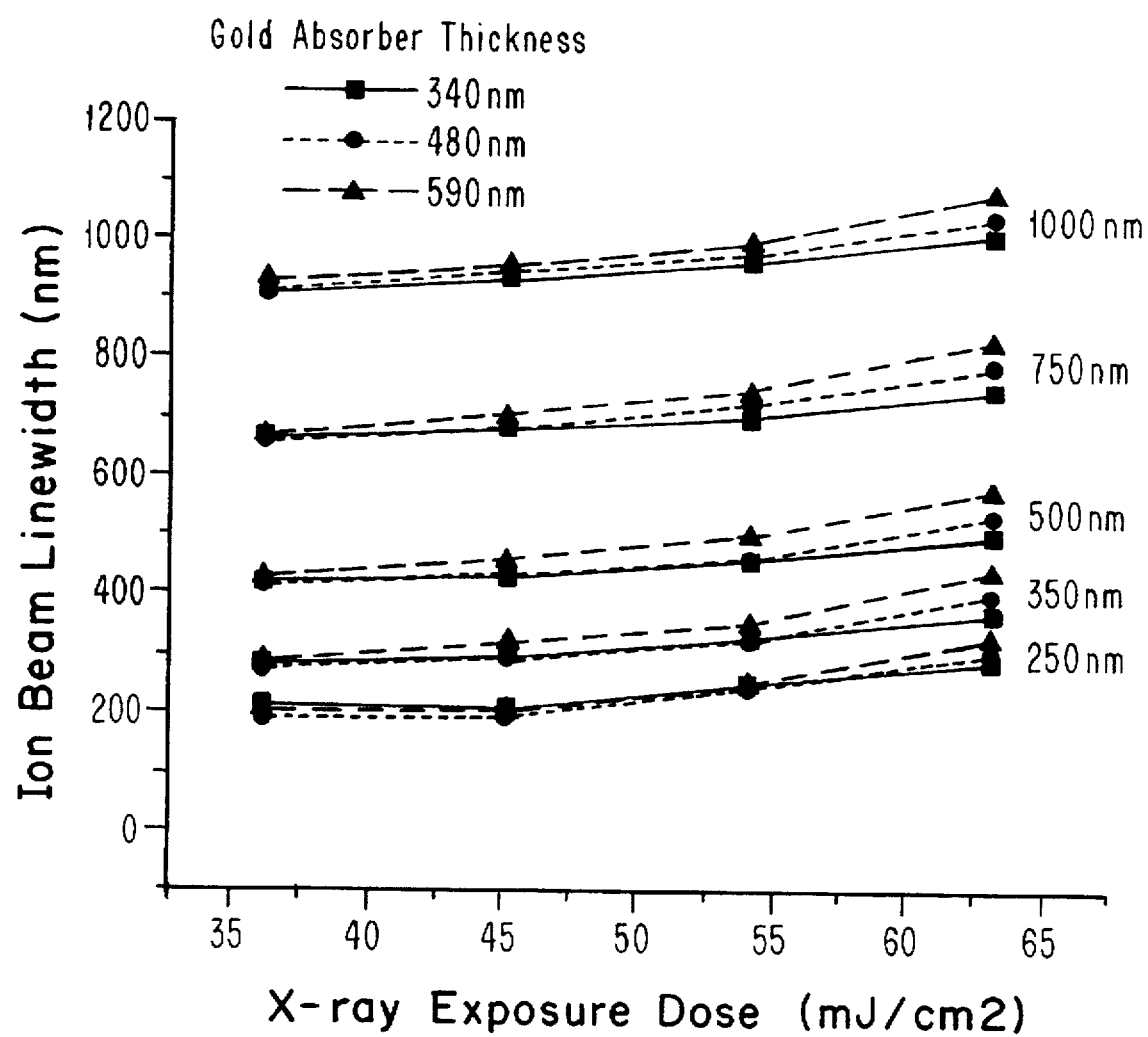
FIGS. 9a–9c show linewidth as a function of x-ray exposure dose according to the present invention.
Figure 9B:
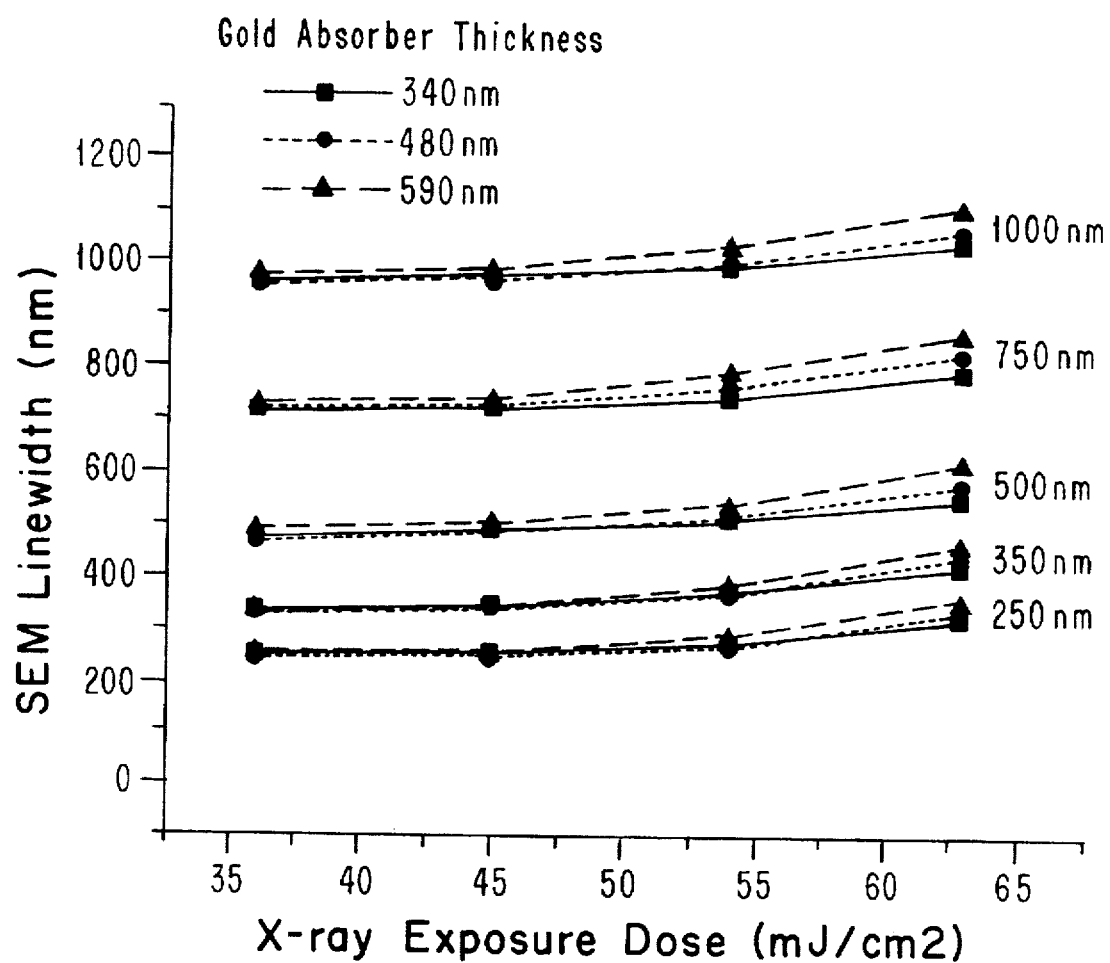
Figure 9C:
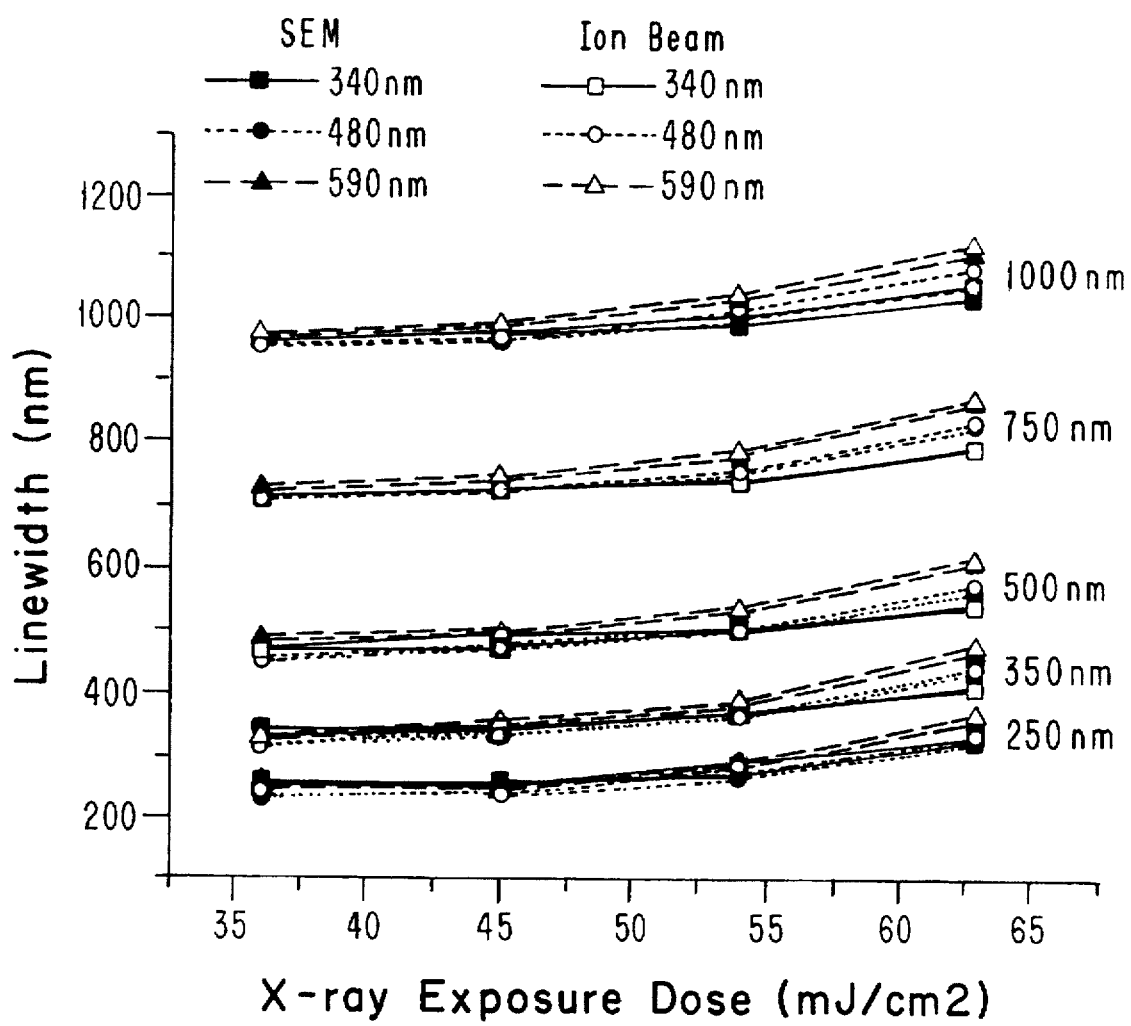

A more direct comparison of SEM and FIB measurements is shown in FIGS. 9a–9c. FIG. 9a shows measurements of 0.25–10 µm spaces in a line space array taken with the ion beam, while FIG. 9b shows measurements from the Hitachi SEM of the same samples. FIGS. 9a–9c show linewidth as a function of x-ray exposure dose, using an x-ray mask with three different thicknesses of gold absorber pattern for each feature. Both the SEM and the FIB are able to detect the small changes in linewidth with exposure does and absorber thickness. A numerical comparison of the ion beam and SEM data reveal a 42.7 nm smaller using the FIB than the SEM. The two data sets are overlaid in FIG. 9c with the 42.7 nm offset subtracted from the SEM measurements. The 1σ deviation of the SEM to the FIB data is 5.7 nm. These small deviations are well within the estimated precision and accuracy of one SEM tool to another, and indicates that the FIB and SEM measurement results are quite comparable. Since no optimization of the ion beam system hardware, process, or analysis algorithms had been attempted, significant improvement in FIB CD metrology is achievable.

Measurement Induced Error

Figure 10A:
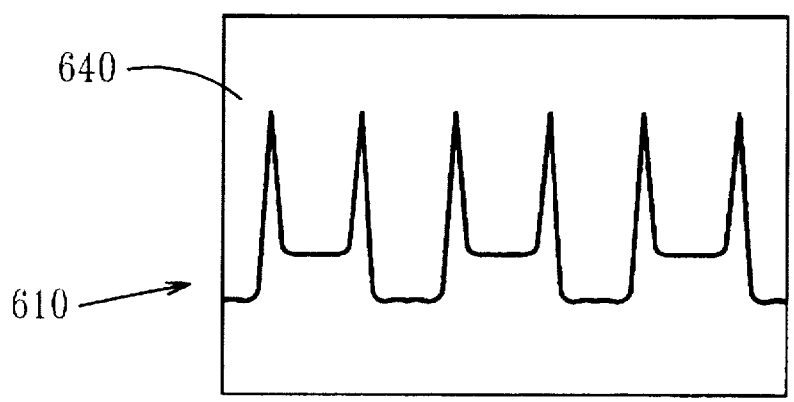
FIG. 10a show a top-down image obtained using the FIB metrology device of FIG. 2 according to the present invention.
Figure 10B:
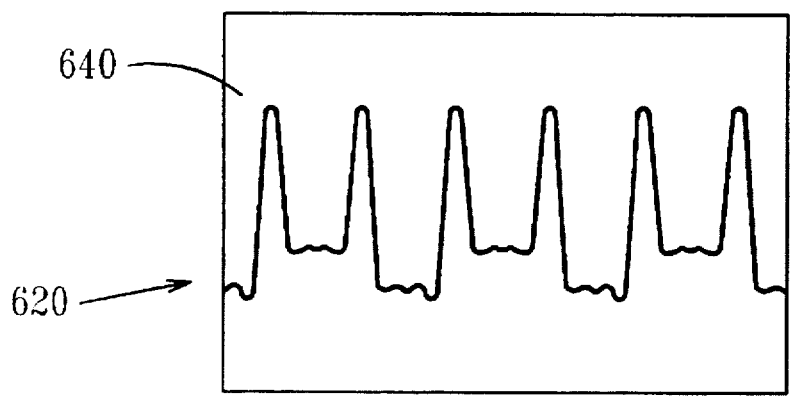
FIGS. 10b–10c show top-down images obtained using a conventional SEM.
Figure 10C:
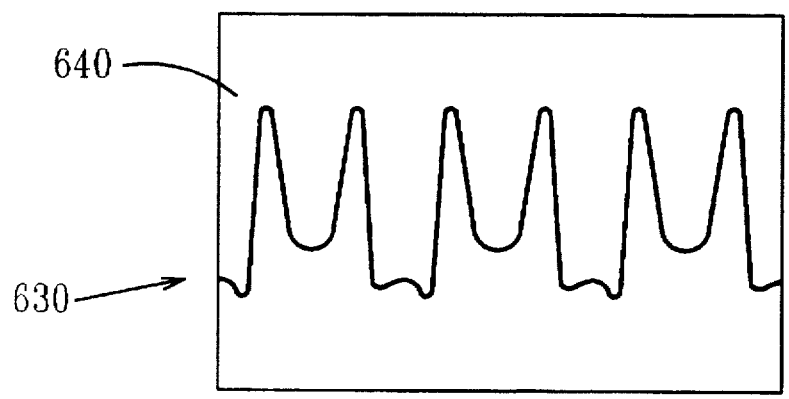

FIGS. 10a–10c show the effect of strong SEM interaction with the resist. FIGS. 10a, 10b show top down images 610, 620 formed using a 3 kV SEM and 7 kV SEM, respectively. FIG. 10c shows a top down images 630 formed with the inventive FIB device 100 of FIG. 2 using a 30 kV gallium (Ga) ion beam. Unlike the FIB formed top-down image 630 of FIG. 10c, images 620, 630 formed from detector signals of SEM devices do not correspond exactly to the resist profile 640. Rather SEM formed images are integrated over the larger interaction range of the electron beam.

This effect is illustrated in FIGS. 10a–10c, which compare detector signals obtained with scanning ion and electron beams. The sample consists of a 1.0 µm line space array in 0.8-µm-thick resist. The resist walls are vertical, and thus the resist profile approximates a nearly perfect rectangular cross-section.

Ideally, a very low-voltage, finely focused ion beam (e.g. 3 keV with 10 nm beam diameter) should have been compared with a state of the art CD SEM operated at 800–1000 eV. Unfortunately, tools with this capability were not available for these experiments. Instead somewhat higher energy ion and electron beams have been compared. FIG. 10a shows the detector signal for a 30 kV Ga ion beam, while FIGS. 10b, 10c show the detector signal for a 3 and 7 kV scanning electron beam.

Although the SEM beam diameter is substantially smaller than the ion beam diameter, the detector signals for the SEM show a longer decay length than the FIB. This can be attributed to the shorter interaction range of the ion beam compared to the electron beam. The detector signal in the inventive ion beam metrology device reflects only from the near surface region of the resist where the ion beam interaction occurs. Thus, the shorter interaction range of the ion beam offers a detector signal which is simpler to interpret for linewidth measurements.

Figure 11A:
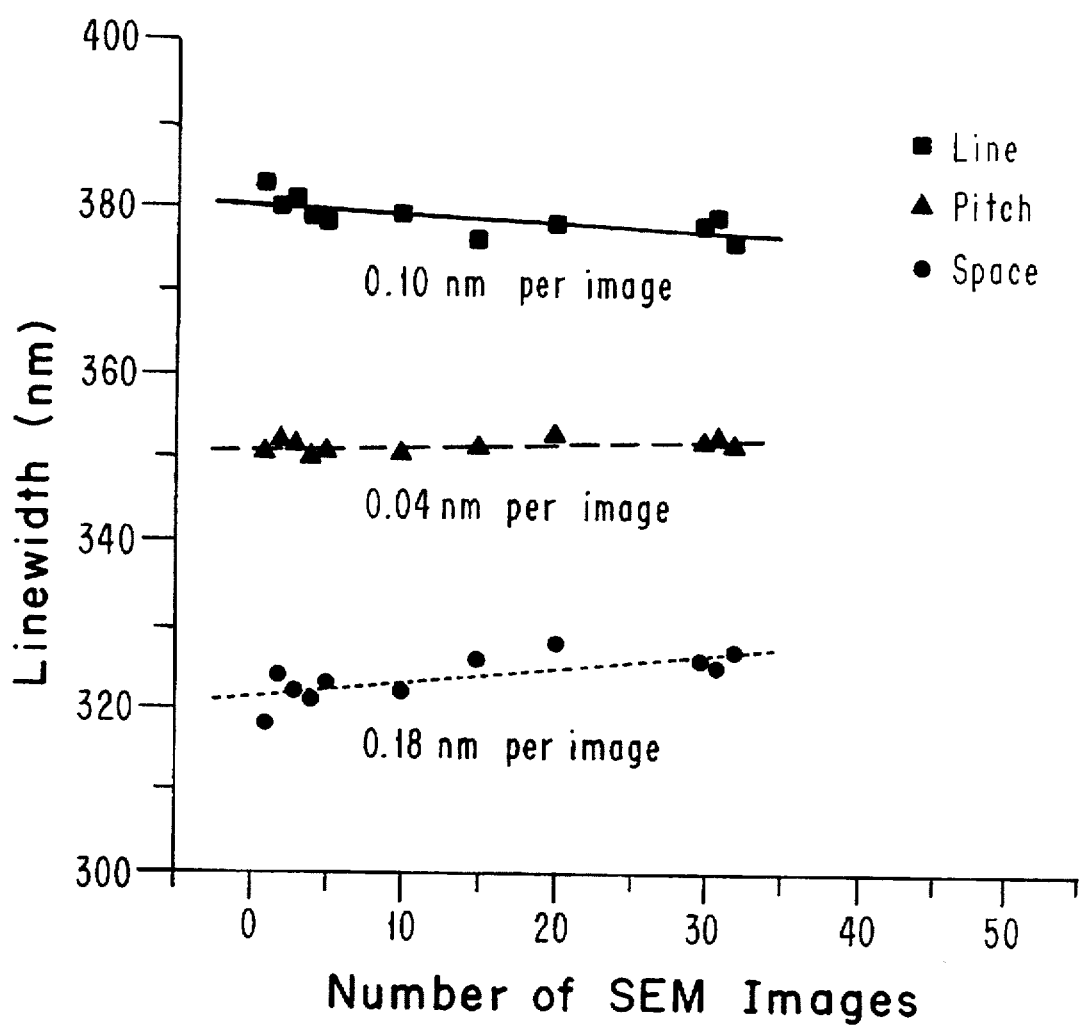
Figure 11C:
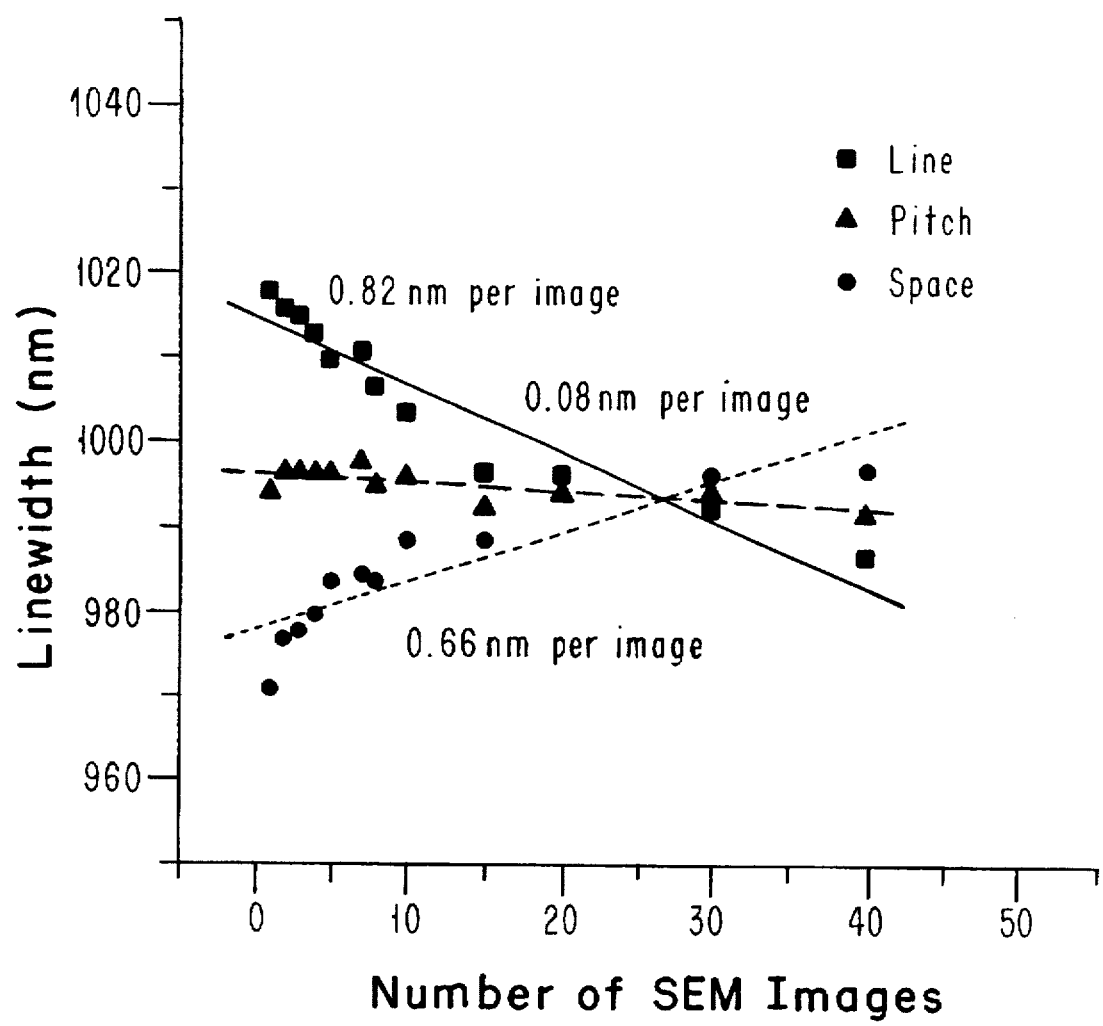

Another effect of the long interaction range of the electron beam is induced resist damage. FIGS. 11a–11c show the measured width of lines and spaces as a function of repeated measurements using a 20 kV electron beam.

As can be seen from FIGS. 11a–11c, repeated SEM measurement induce measurement errors due to shrinkage/volatilization of the resist as the electron beam travels therethrough.

For the 350 nm nominal line space array shown FIG. 11a, repeated measurements induce less than 0.2 nm change in linewidth per measurement. However, when larger blocks of resist are exposed to the electron beam, large dimensional changes are induced by the measurement process. For example, FIG. 11b shows nearly a 1 nm increase per measurement for isolated 350 nm spaces. Similarly, the 1 µm line space array in FIG. 11c experiences approximately a 0.8 nm change in the measured width of spaces and lines per SEM measurement.

Note that there is a large variation in the induced dimensional change with feature type (isolated versus nested) and feature size (350 nm versus 1.0 µm). This variation with feature type and size makes it difficult to compensate for the effect.

In general, greater dimensional change is induced in the resist as the electron dose is increased and as the volume of continuous resist, which is exposed to the electron beam, is increased. This has significant implications for the fundamental limits of resist measurement precision. For example, in order to significantly improve measurement precision, it is necessary to improve the signal-to-noise ratio in the SEM image. This is typically accomplished by increased the number of measurement (averaging) or increasing the number of incident electrons per measurement (dose).

However, the induced linewidth changes shown in FIGS. 11b and 11c, result in reduction of measurement precision as multiple measurements are averaged or the electron dose increased. This problem becomes more serious for future integrated circuits for two reasons: (1) the deep UV resists under development show much larger volume changes upon exposure than current I line production resists, indicating greater susceptibility to electron-beam-induced damage, and (2) as feature size decreases, the magnification employed in the SEM during the linewidth measurement must be increased to maintain the required accuracy and precision. This will increase the electron dose into the resist during a measurement resulting in increased resist damage.

Since the rate of energy loss of an energetic ion beam is orders of magnitude greater than a corresponding electron beam, the penetration range for a focused ion beam is only on the order of 10–100 nm versus 100–1000 nm for an electron beam. Therefore, the bulk of the resist is not affected by the ion beam even though the surface layer of the resist may be more highly damaged via sputter erosion, volatilization, and carbonization.

Figure 12A:
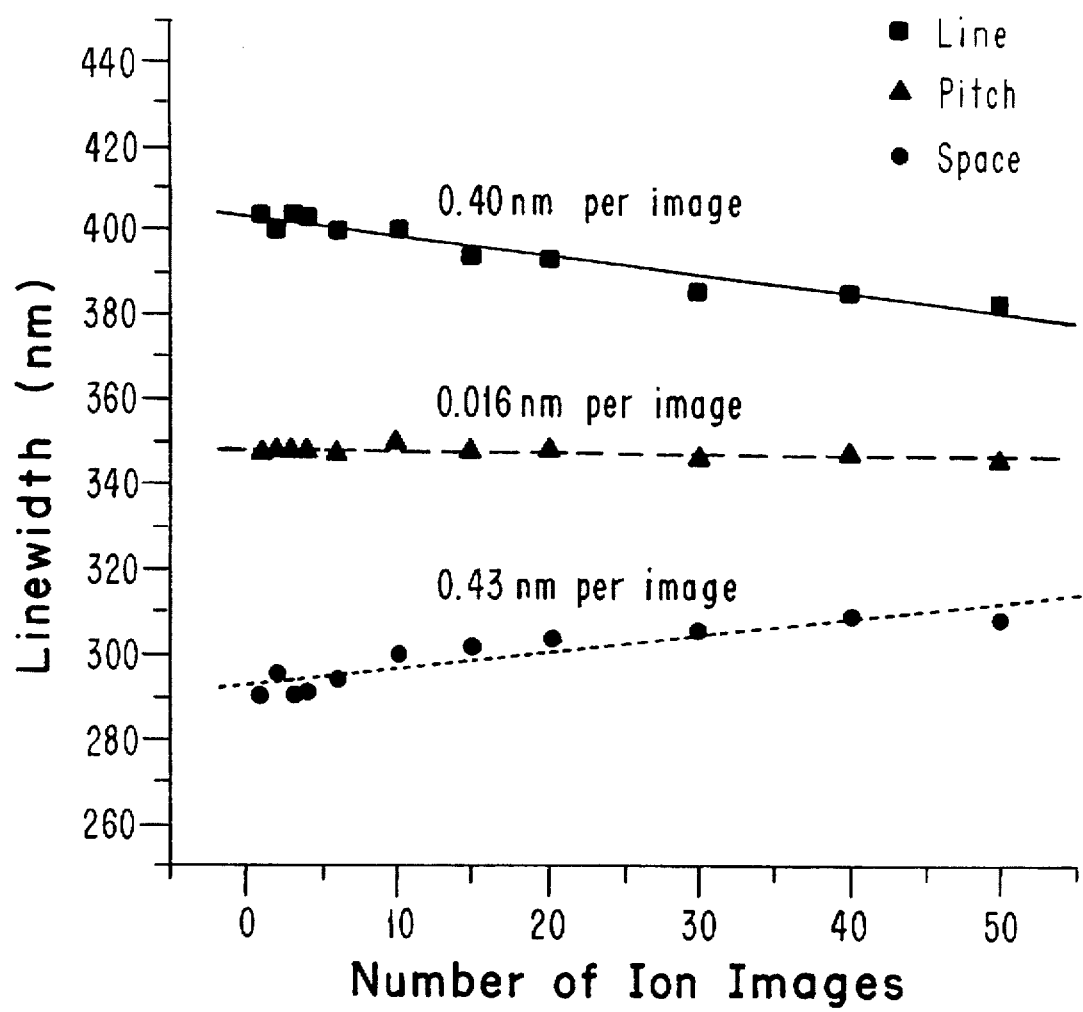
FIGS. 12a–12b show the effect of repeated linewidth measurements using the FIB metrology device of FIG. 2 according to the present invention.
Figure 12B:
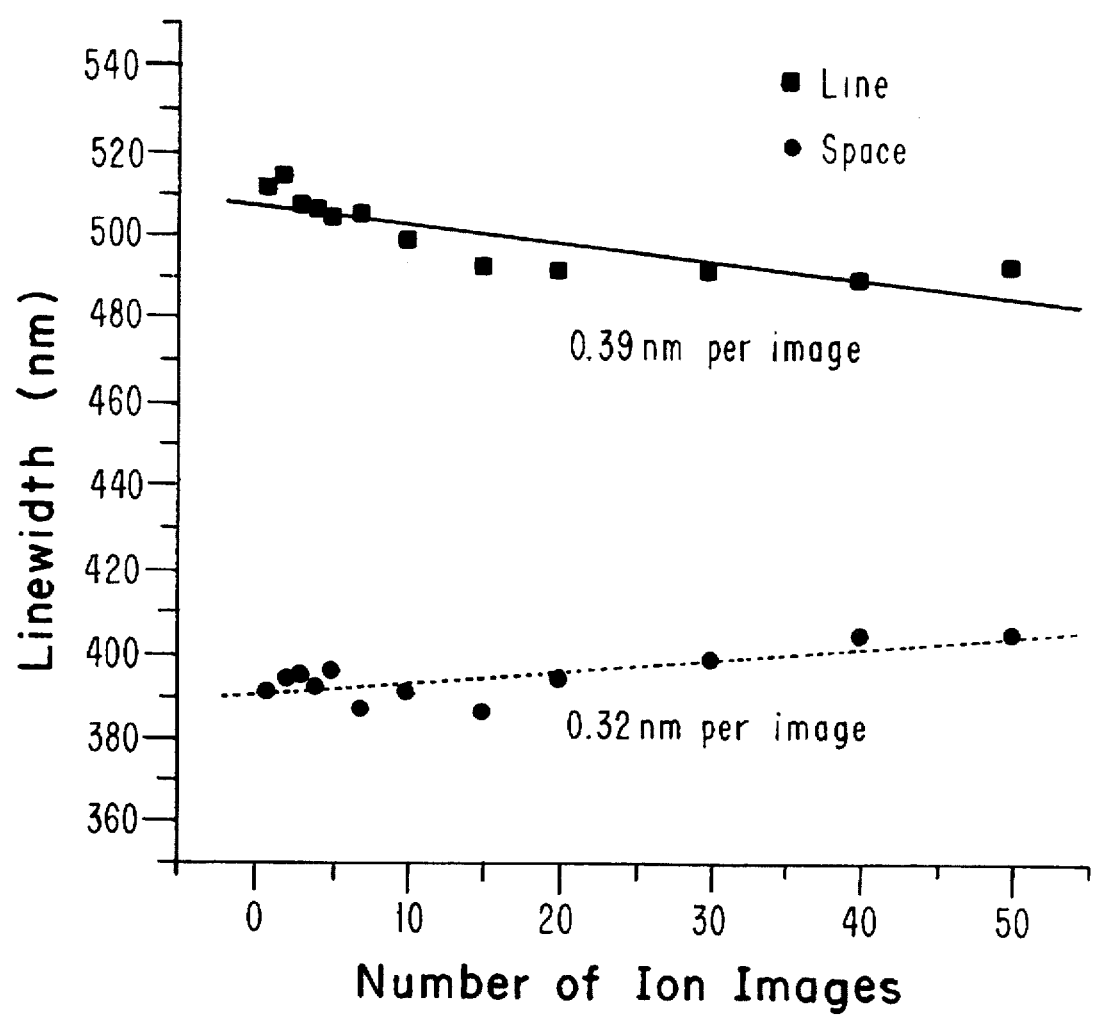

By confining the damage to the near surface, less dimensional change is induced in the bulk resist. This is illustrated in FIGS. 12a–12b. The effect of repeated measurements with a 100 kV Ga ion beam on the size of lines and spaces in a 350 nm line space array is shown in FIG. 12a, while FIG. 12b shows the effect on isolated 350 nm lines and spaces. Note that each successive ion image induces approximately 0.4 nm change in linewidth, independent of feature type. This is significantly smaller than the dimensional changes induced by the SEM shown in FIGS. 11b and 11c. In addition, much smaller variation in dimensional change occurs with feature type and size using the ion beam versus the SEM. This indicates that it is easier to compensate for dimensional changes induced by the ion beam.

Figure 13:
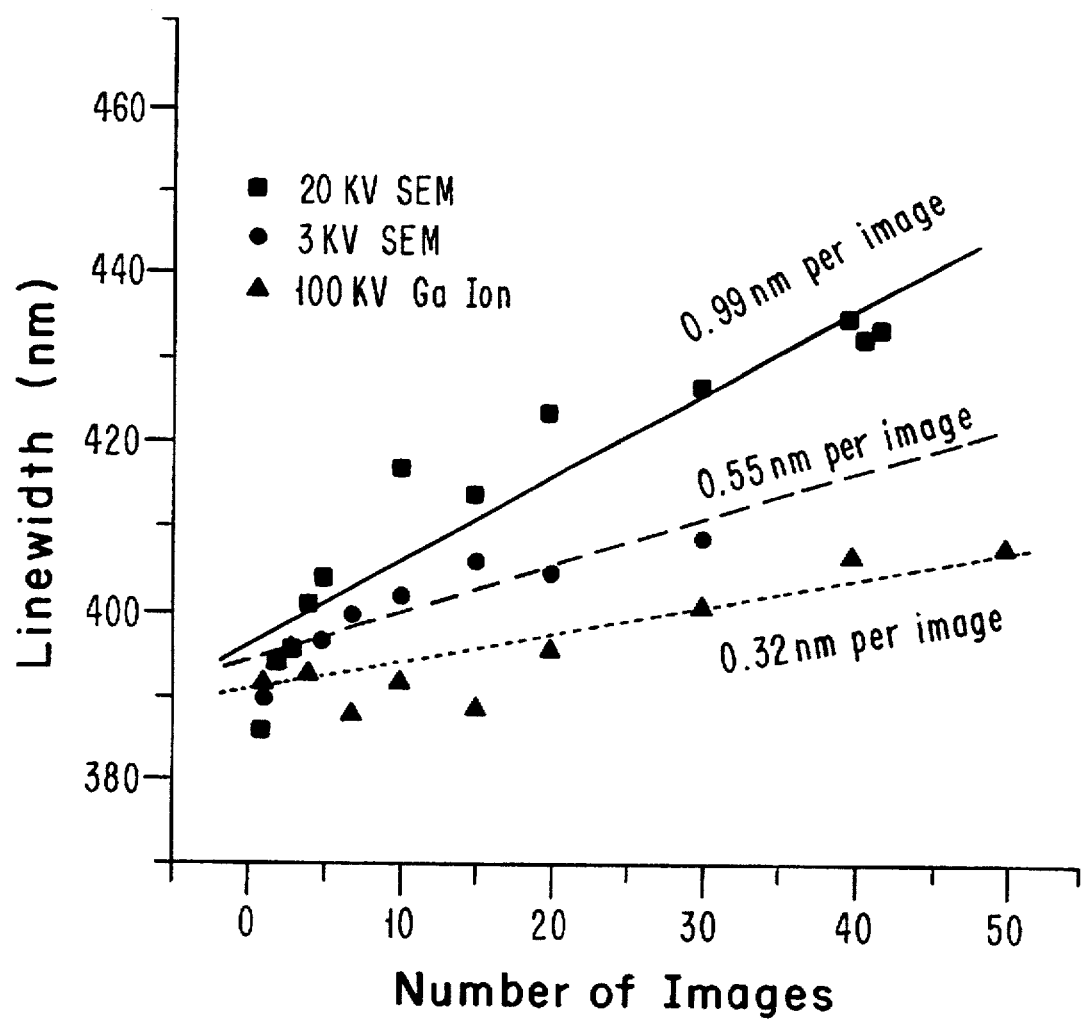
FIG. 13 compares changes in measured linewidths using the inventive FIB of FIG. 2 and conventional SEMs.

It might seem that these problems can be reduced or eliminated through the use of low-voltage electron beams. However, even the lowest voltage SEM will have difficulty achieving the short interaction range and reduced resist damage of a focused ion beam. FIG. 13 illustrates this point.

FIG. 13 shows changes in measured width of a 350 nm isolated space with repeated measurements using 20 and 3 kV electron beams, and a 100 kV ion beam. Linewidth changes of 0.99, 0.55, and 0.32 nm per image, respectively, were obtained. The ion beam produces the least measurement induced change.

While it appears that reducing the electron-beam energy has reduced the induced linewidth change, in fact on a per-electron basis, it has increased. The SEM current at 3 kV was 7 pA, approximately 1/7 the current at 20 kV (53 pA) while the ion beam current was approximately 15 pA. Thus, on a per-electron basis, the 3 kV SEM induces nearly 4 nm linewidth change per equivalent 20 kV SEM image. This occurs for the following reason. A 3 kV electron actually deposits more energy in the resist film than a 20 kV electron since the stopping power increases as the electron-beam energy decreases. However, reducing the ion beam energy does result in a beneficial reduction in measurement induced error while holding the ion dose constant. Measurements of 0.25 µm isolated lines using a 30 kV Ga ion beam show less than 0.3 nm change in linewidth per measurement versus 0.4 nm at 100 kV.

Resist Cross-Sectioning

Two major factors degrade the quality of FIB resist cross-sections. One factor is the considerable energy in FIB tails extending out to beyond 50 beam radii.

The other factor is redeposition of sputtered material.

The large energy at the beam tails erodes or etches a large area. This causes distortion of resist profiles in the region around the cross-section. The present invention uses the smallest possible ion beam diameter for the entire cross-sectioning process, to minimize this effect, and provide a high quality image of the resist cross-section. Illustratively, the beam diameter is 0.1 µm for an ion beam intensity of 100 pA.

The visualization of resist cross-sections provides valuable metrology information which complements conventional top-down CD measurements. For example, resist cross-section images reveal that holes of a deep trench capacitor in advanced dynamic random access memory (DRAM) chips, are significantly larger at the top of the hole than at the silicon-resist interface. Conventional top-down CD metrology would yield a measurement which is dominated by the size of the top of the hole. This is not desirable since, for most IC processes, it is the size of the hole at the silicon-resist interface that is critical.

Although good resist cross-sections of "closed" patterns, such as contact holes and trench capacitors, shown in FIG. 8a, may be formed using conventional FIB sputtering, "open" patterns, such as gate conductors shown in FIG. 8b, are far more difficult to cross-section due to redeposition of sputtered material.

Material sputtered during the cross-sectioning of a line space array is redeposited on the exposed edges of the resist lines, resulting in a distortion of the exposed resist profile. The present invention uses a gas assisted etching process which dramatically improves the quality of resist cross-sections. Both $H_2O$ and $H_2O_2$ have been employed as the etching gas with equally effective results. The process enhances the resist etch rate, i.e., the volume of polymer material removed per incident ion, by approximately a factor of 3 to 10 using etching gas pressure of 3 to 80 mtorr. In addition to enchancing the polymer etch rate, the process simultaneously suppresses the sputter erosion of the underlying silicon.

In addition to reducing the time required to form a cross-section, the redeposition of back sputtered material on surrounding features is virtually eliminated. The reduces distortion of the resist edges adjacent to the cross-section which results from the gas assisted etching process is readily observable.

The invention FIB device and method are powerful monitoring tools and process for CD/top-down and cross-sectional metrology. Higher quality images and precise measurement are obtained using the inventive FIB device and method. In addition, the inventive FIB device and method rapidly and inexpensively create high quality resist cross-sections without cleaving wafers. This provides an inexpensive device and method of imaging and measuring resist profiles on in-process wafers, with minimal damage to the wafer. This high quality cross-sectional image provides a much needed compliment to top-down measurements. Moreover, the inventive FIB device and method allows for high quality and rapid cutting of wafers.

The inventive FIB metrology device and method allow accurate top-down measurements of semiconductor feature sizes with minimal contributions from areas which are lateral or below the feature being measured. In addition, the inventive FIB metrology device and method minimize damage caused to various layer of a semiconductor during partial exposure of the semiconductor's cross-section. This allows in-situ cross-sectional measurements without breaking the wafer. Furthermore, the FIB metrology device and method provide quick and accurate cross-sectioning and imaging thereof. Moreover, images of 3-D resist profiles are quickly obtained without cutting through and destroying the wafer.

While the invention has been particularly shown and described with respect to illustrative and preformed embodiments thereof, it will be understood by those skilled in the art that the foregoing and other changes in form and details may be made therein without departing from the spirit and scope of the invention which should be linked only by the scope of the appended claims.

Having thus described our invention, what I claim as new, and desire to secure by Letters Patent is:

1. A focused ion beam metrology device comprising:

a focused ion beam source which produces low intensity focused ion beams directed to a semiconductor device having features thereon;

a detector which detects electrons or ions emitted from said semiconductor device;

a processor which receives data from said detector and measures dimensions of said features from said data;

a discharge device which introduces an etch-enhancing material toward said semiconductor device; and a control device connected to said ion beam device to vary intensity of said focused ion beams for generating high intensity focused ion beams to etch said semiconductor device;

said etch-enhancing material being one of $H_2O$ gas, $H_2O_2$ gas, and a combination of said two gases.

2. The metrology device of claim 1, wherein said detector is located substantially above said semiconductor device for top-down linewidth measurements.

3. The metrology device of claim 1 further comprising a display device connected to said processor, wherein said display device displays an image of said semiconductor device.

4. The metrology device of claim 1, wherein etch-enhancing material prevents redeposition of etched material on said semiconductor device.

5. The metrology device of claim 1, wherein high intensity focused ion beams completely etch through said semiconductor device.

6. The metrology device of claim 1, wherein the semiconductor device includes a polymer or other carbon containing material.

7. The metrology device of claim 1, wherein said discharge device selectively deposits a planarization material on said semiconductor device.

8. The metrology device of claim 7, wherein said planarization material is one of gold, platinum, tungsten, aluminum and carbon.

9. The metrology device of claim 1, wherein said high intensity ion beams successively etch a top surface of said feature, and said low intensity ions beams scan said feature between said successive etches to produce successive top-down images of said feature; and wherein said processor overlays said successive top-down feature images to form a three-dimensional profile of said feature.

10. The metrology device of claim 1, wherein said high intensity ion beams etch a crater in said semiconductor device exposing a cross-section of said semiconductor device, and said low intensity ion beams scan said cross-section at a predetermined angle to form an image of said cross-section.

11. The metrology device of claim 10, further comprising a movable platform for holding said semiconductor device, wherein said movable platform is tilted at said predetermined angle during said low intensity ion beam scanning of said cross-section.

12. The metrology device of claim 1, further comprising a second focused ion beam source which generates low intensity focused ion beams;
wherein said focused ion beam source generates high intensity focused ion beams to etch a crater in said semiconductor device exposing a cross-section of said semiconductor device, and wherein said second focused ion beam source is configured to scan said cross-section at a predetermined angle to form an image of said cross-section.

13. A method of measuring size of a polymer feature of a semiconductor device comprising the steps of:
(a) scanning a semiconductor device with low intensity focused ion beams from an ion beam source;
(b) detecting electrons or ions emitted from said semiconductor device using a detector; and
(c) measuring a linewidth of said polymer feature from said detected electrons or ions by a processor connected to said detector.

14. The method of claim 13, further comprising, after step (c), the step of forming a top-down image of said semiconductor device on an image forming device connected to said processor.

15. The method of claim 13, further comprising, after step (a), the steps of:
introducing an etch-enhancing material toward said semiconductor device through a discharge device;
etching a top surface of said feature with a high intensity focused ion beam from said ion beam source;
forming a top-down image of said feature on an image forming device connected to said processor;
repeating said etching and forming steps until said feature is completely etched to form successive top-down images of said etched feature; and
overlaying said top-down images of said feature by said processor to form a three-dimensional profile of said feature.

16. A method of forming a three dimensional profile of a feature of a semiconductor device comprising the steps of:
introducing an etch-enhancing material toward said semiconductor device through a discharge device;
etching a top surface of said feature with a high intensity focused ion beam from an ion beam source;
forming a top-down image of said to top surface on an image forming device connected to a processor;
repeating said etching and forming steps until said feature is completely etched from top to bottom to form successive top-down images of said etched feature; and
overlaying said top-down images of said feature by said processor to form said three dimensional profile of said feature.

17. The method of claim 16, wherein said introducing step introduces one of $H_2O$ gas $H_2O_2$ gas, and a combination of said two gases.

18. A method of measuring a cross-section profile of a semiconductor device comprising the steps of:
introducing an etch-enhancing material toward said semiconductor device through a discharge device, said etch-enhancing material being one of $H_2O$ gas, $H_2O_2$ gas, and a combination of said two gases;
etching a crater to expose said cross-section by a high intensity focused ion beam generated from a first ion beam source;
directing a low intensity ion beam toward said cross-section; and
forming an image of said cross-section on an image forming device from low intensity ion beams generated from said ion beam source and reflected from said cross-section.

19. The method of claim 18, wherein said directing step includes the step of tilting said semiconductor device so that said cross-section faces toward said ion beam source.

20. The method of claim 19, wherein said tilting step tilts said semiconductor device between 40° to 75° from an axis parallel to said focused ion beams.

21. The method of claim 18, wherein said directing step includes the step of generating said low intensity ion beam from a second ion beam source angularly displaced from said first ion beam source by a predetermined angle.

22. The method of claim 18, wherein said directing step includes the step of angularly displacing said first ion beam source be a predetermined angle to generate said low intensity ion beam.

23. The method of claim 18, further comprising, before said etch-enhancing material introducing step, the step of planarizing said semiconductor device by selective maskless deposition of selected material introduced toward said semiconductor device through said discharge device.

24. The method of claim 23, wherein said planarizing step deposits one of gold, platinum, tungsten, aluminum and carbon.

25. A method of etching a semiconductor device comprising the steps of:
introducing an etch-enhancing material toward said semiconductor device through a discharge device; and
etching said semiconductor device with a focused ion beam from an ion beam source; wherein said introducing step increases speed and accuracy of said etching step and said etch-enhancing material is one of $H_2O$ gas, $H_2O_2$ gas, and a combination of said two gases.

26. A method for carrying out focused particle beam machining of material from a substrate comprising the steps of:

(a maintaining the substrate within a vacuum;

(b) applying water vapor to the substrate; and (c) bombarding the substrate and applied water vapor within a focused particle beam.

27. The method of claim 26, wherein the focused particle beam comprises ions.

28. The method of claim 27, wherein the focused particle beam comprises gallium ions.

29. The method of claim 26, wherein the focused particle beam comprises electrons.

30. The method of claim 26, wherein the water vapor is applied to said material in said step (b) by gas jet injecting.

31. The method of claim 26, wherein said material comprises polymer.

32. The method of claim 26, wherein said step (c) removes said material away from the substrate surface in a defined pattern.

33. The method of claim 26, wherein said material is selected so that said water vapor enhances removal of said material.

34. A method for focused particle beam machining of a substrate, said substrate comprising a first material and a second material, said method comprising the steps of:

(a) maintaining the substrate within a vacuum;

(b) applying water vapor to the substrate; and (c) bombarding both the first and second materials and applied water vapor with a focused particle beam, said materials selected so that said water vapor selectively increases the rate of removal of the first material.

35. The method of claim 34, wherein the focused particle beam comprises ions.

36. The method of claim 34, wherein the focused particle beam comprises electrons.

37. The method of claim 34, wherein the water vapor is applied to the substrate in said step (b) by gas jet injecting.

38. The method of claim 34, wherein said step (c) removes the first and second materials away from the substrate in a defined pattern.

39. The method of claim 34, wherein the second material is aluminum.

40. The method of claim 34, wherein the second material is silicon.

41. The method of claim 34, wherein the first material is substantially completely removed from the substrate and the second material is substantially not removed from the substrate.

42. The method of claim 34, wherein the first material comprises polymer and the second material comprises aluminum.

43. The metrology device of claim 1, further comprising a scanning electron microscope which is angularly displaced from said focused ion beam source by a predetermined angle;

wherein said focused ion beam source generates high intensity focused ion beams to etch a crater in said semiconductor device exposing a cross-section of said semiconductor device, and wherein said scanning electron microscope scans said cross-section to form an image thereof.

* * * * *